(12) United States Patent
Hirose et al.

(10) Patent No.: US 7,923,800 B2
(45) Date of Patent: Apr. 12, 2011

(54) SEMICONDUCTOR DEVICE AND ELECTRONIC DEVICE

(75) Inventors: Atsushi Hirose, Atsugi (JP); Hideaki Shishido, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 208 days.

(21) Appl. No.: 12/000,824

(22) Filed: Dec. 18, 2007

(65) Prior Publication Data
US 2008/0156368 A1 Jul. 3, 2008

(30) Foreign Application Priority Data
Dec. 27, 2006 (JP) .................... 2006-351877

(51) Int. Cl.
*H01L 31/0232* (2006.01)
(52) U.S. Cl. ......... 257/433; 257/290; 257/435; 257/461
(58) Field of Classification Search .................. 257/290, 257/461, 444, 446, 433, 435, E29.336
See application file for complete search history.

(56) References Cited

U.S. PATENT DOCUMENTS

| | | | |
|---|---|---|---|
| 4,454,418 A | 6/1984 | Walker | |
| 5,654,203 A | 8/1997 | Ohtani et al. | |
| 5,936,231 A | 8/1999 | Michiyama et al. | |
| 5,956,009 A | 9/1999 | Zhang et al. | |
| 6,288,388 B1 | 9/2001 | Zhang et al. | |
| 6,358,767 B2 | 3/2002 | Eguchi | |
| 6,411,351 B1 | 6/2002 | Zhang et al. | |
| 6,953,735 B2 | 10/2005 | Yamazaki et al. | |
| 6,982,406 B2 | 1/2006 | Chen | |
| 7,196,360 B2 | 3/2007 | Seo et al. | |
| 7,253,391 B2 | 8/2007 | Koyama et al. | |
| 7,462,813 B2 | 12/2008 | Hirose et al. | |
| 7,485,838 B2 | 2/2009 | Nishi et al. | |
| 7,495,272 B2 | 2/2009 | Maruyama et al. | |
| 7,531,784 B2 | 5/2009 | Arao et al. | |
| 7,537,976 B2 | 5/2009 | Hirose | |
| 7,635,863 B2 | 12/2009 | Yamazaki et al. | |
| 7,667,272 B2 | 2/2010 | Hirose | |
| 7,705,283 B2 | 4/2010 | Arao et al. | |
| 7,737,478 B2 | 6/2010 | Yanagisawa et al. | |
| 7,759,629 B2 | 7/2010 | Yamazaki et al. | |
| 2004/0252867 A1 * | 12/2004 | Lan et al. ...................... | 382/124 |
| 2006/0186497 A1 * | 8/2006 | Nishi et al. .................... | 257/428 |
| 2007/0181875 A1 | 8/2007 | Yamazaki et al. | |

(Continued)

FOREIGN PATENT DOCUMENTS

JP 9-329493 12/1997

(Continued)

*Primary Examiner* — Leonardo Andújar
*Assistant Examiner* — Jordan Klein
(74) *Attorney, Agent, or Firm* — Eric J. Robinson; Robinson Intellectual Property Law Office, P.C.

(57) ABSTRACT

The present invention has a photodiode and a circuit used to amplify the output of the photodiode. Two terminals are formed over the photodiode and circuit with an insulating layer interposed therebetween, and a dummy electrode with a larger area than that of either of the two terminals is formed thereover, adjacent to the two terminals. The dummy electrode is not connected to the photodiode or to the circuit of the semiconductor device. Because the dummy electrode has a wide area, damage due to electrostatic discharge occurs in the dummy electrode more easily than in the two terminals; thus, damage due to electrostatic discharge can be prevented from occurring in the semiconductor device.

14 Claims, 22 Drawing Sheets

U.S. PATENT DOCUMENTS

| | | |
|---|---|---|
| 2008/0078923 A1 | 4/2008 | Hirose |
| 2008/0099664 A1 | 5/2008 | Yamazaki et al. |
| 2008/0151262 A1 | 6/2008 | Tanaka et al. |
| 2009/0027372 A1 | 1/2009 | Shishido et al. |
| 2009/0065588 A1 | 3/2009 | Aoki et al. |
| 2009/0121119 A1 | 5/2009 | Nishi et al. |
| 2009/0289173 A1 | 11/2009 | Koyama et al. |
| 2010/0006746 A1 | 1/2010 | Hirose |
| 2010/0051787 A1 | 3/2010 | Hirose et al. |

FOREIGN PATENT DOCUMENTS

| | | |
|---|---|---|
| JP | 3444093 | 9/2003 |

* cited by examiner

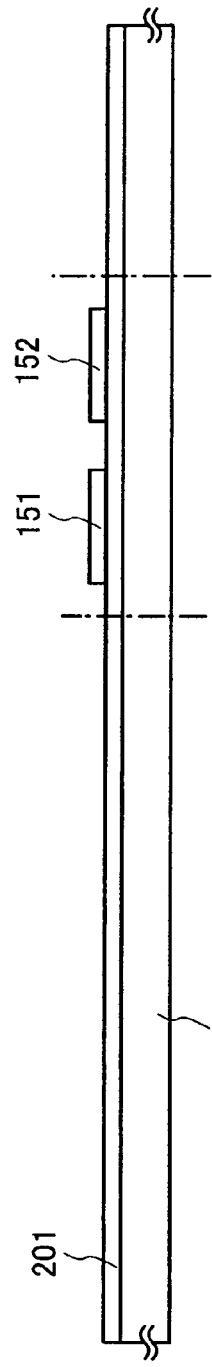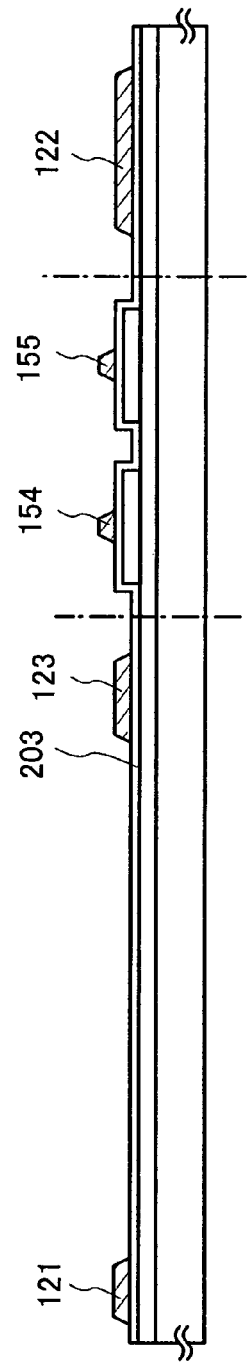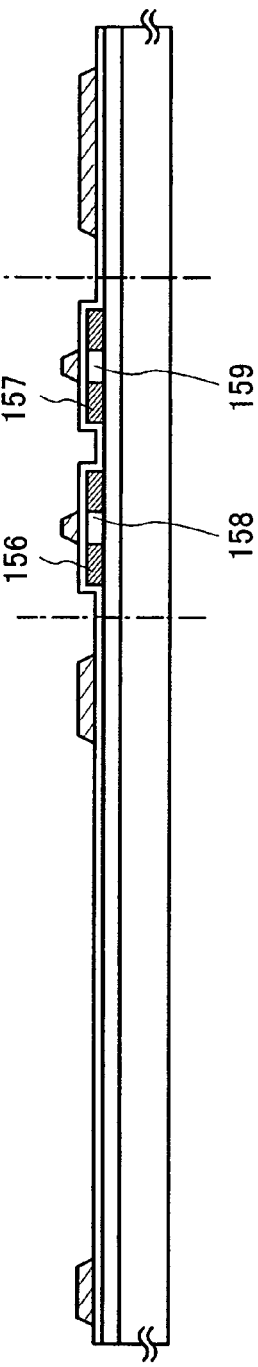

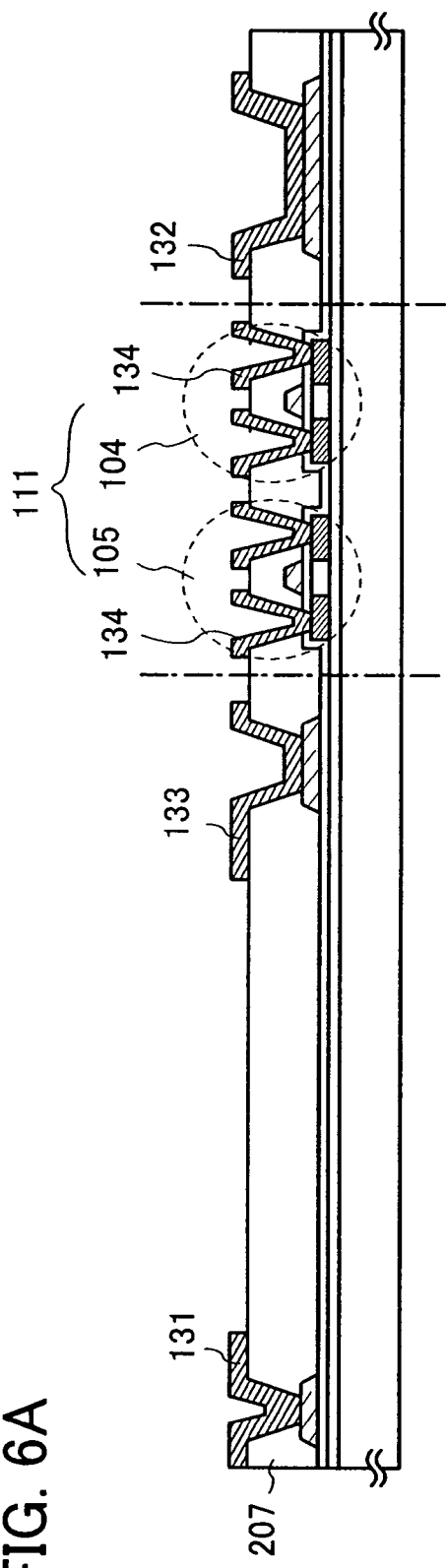
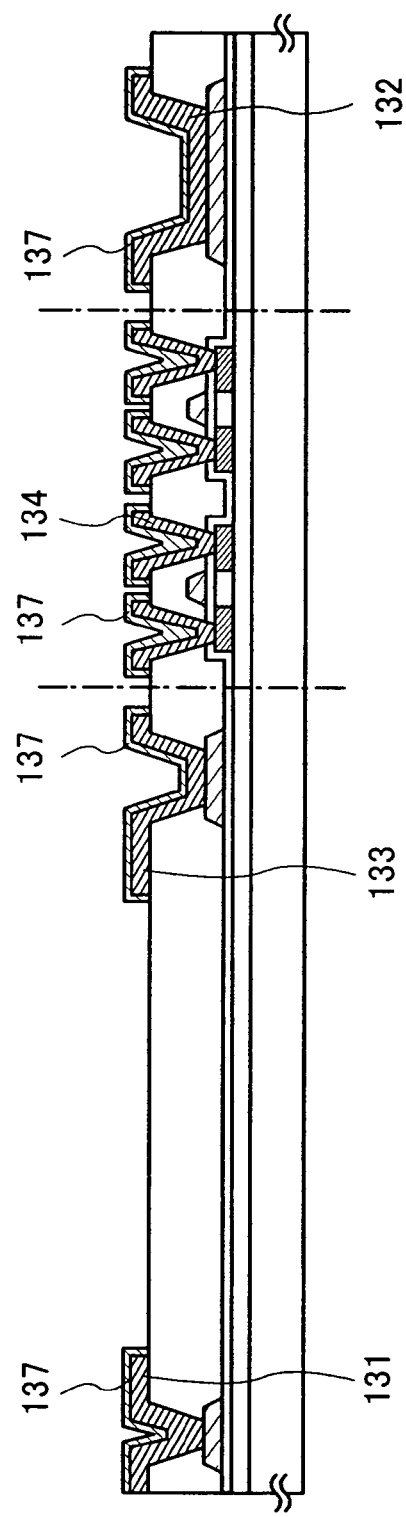

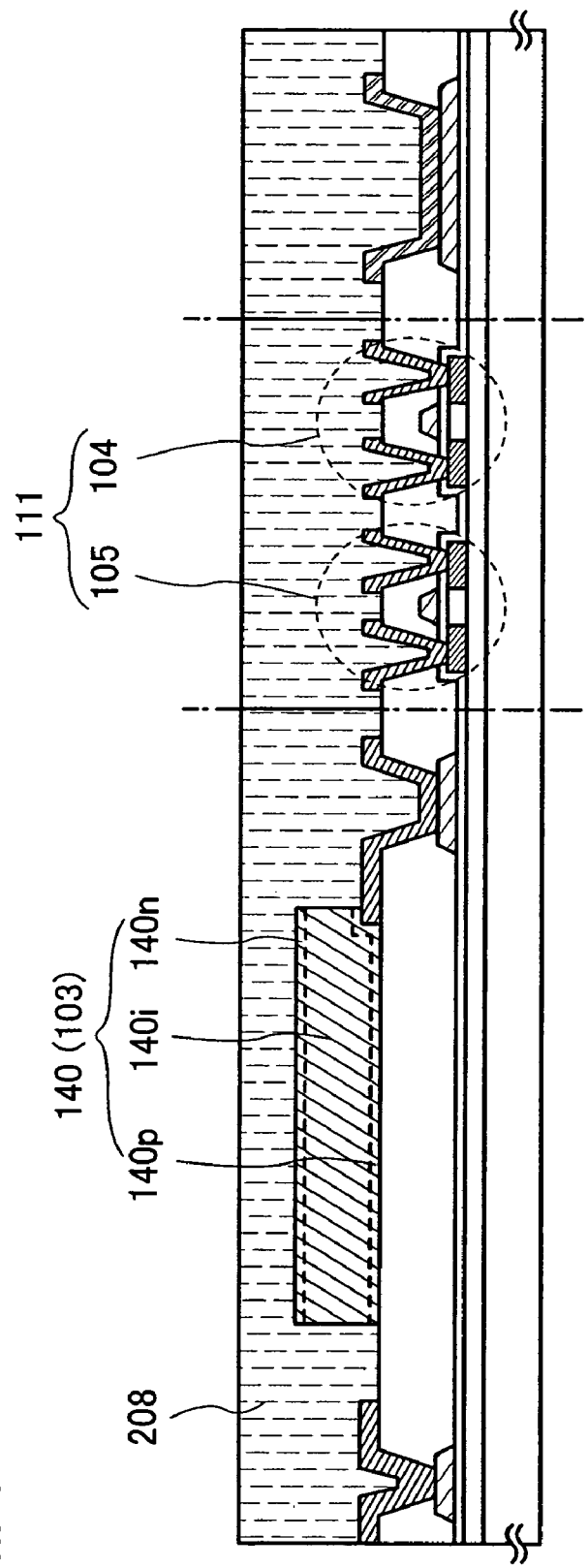

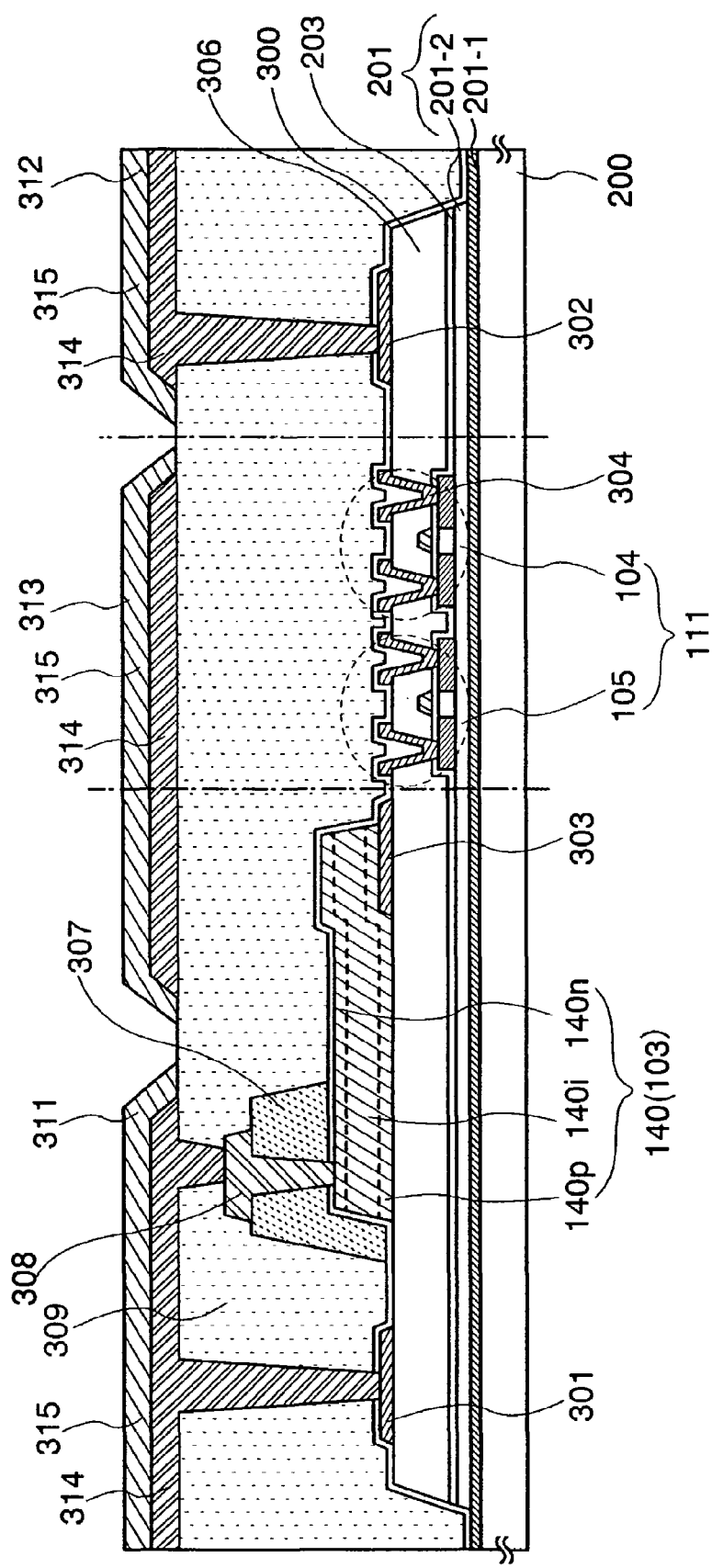

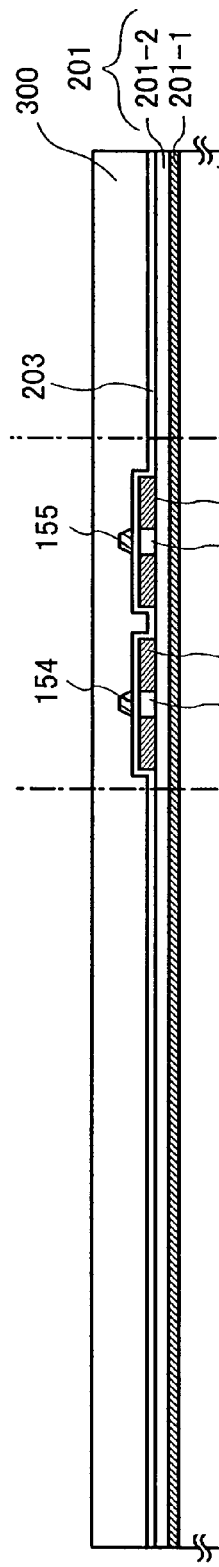
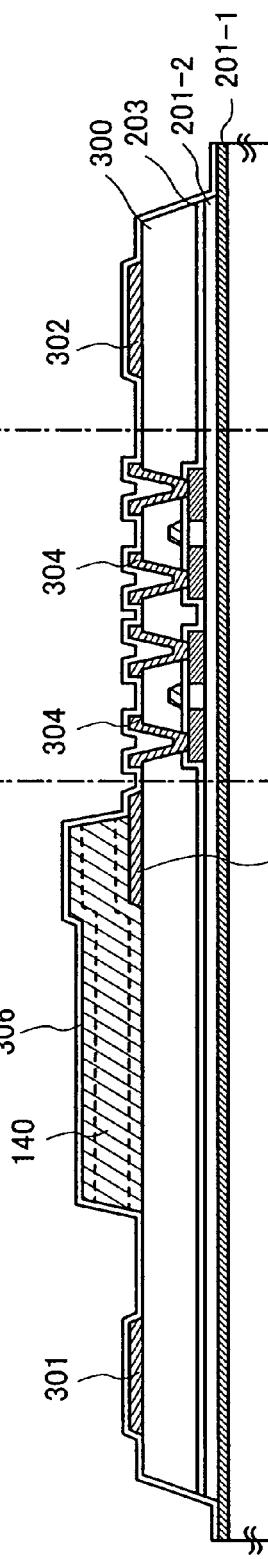
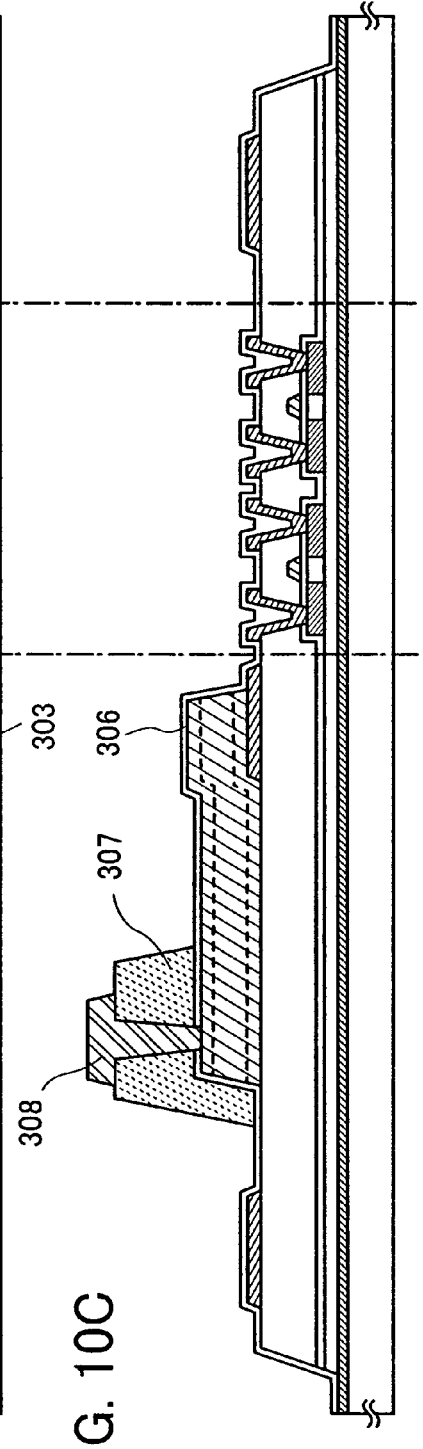
FIG. 10A
FIG. 10B
FIG. 10C

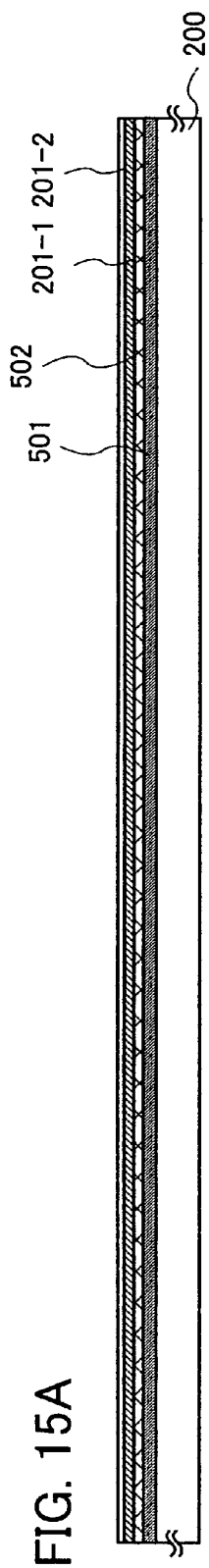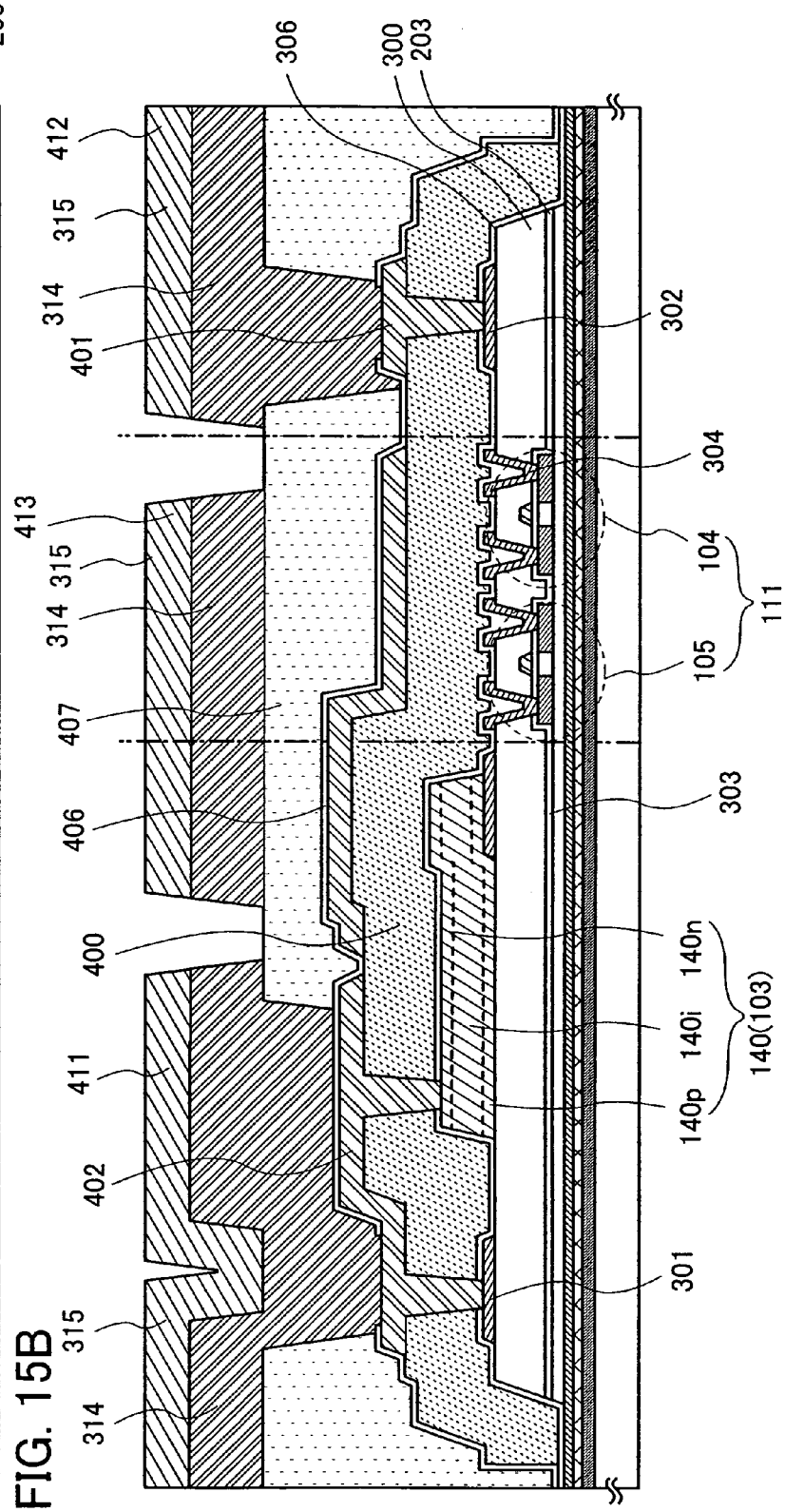
FIG. 15A
FIG. 15B

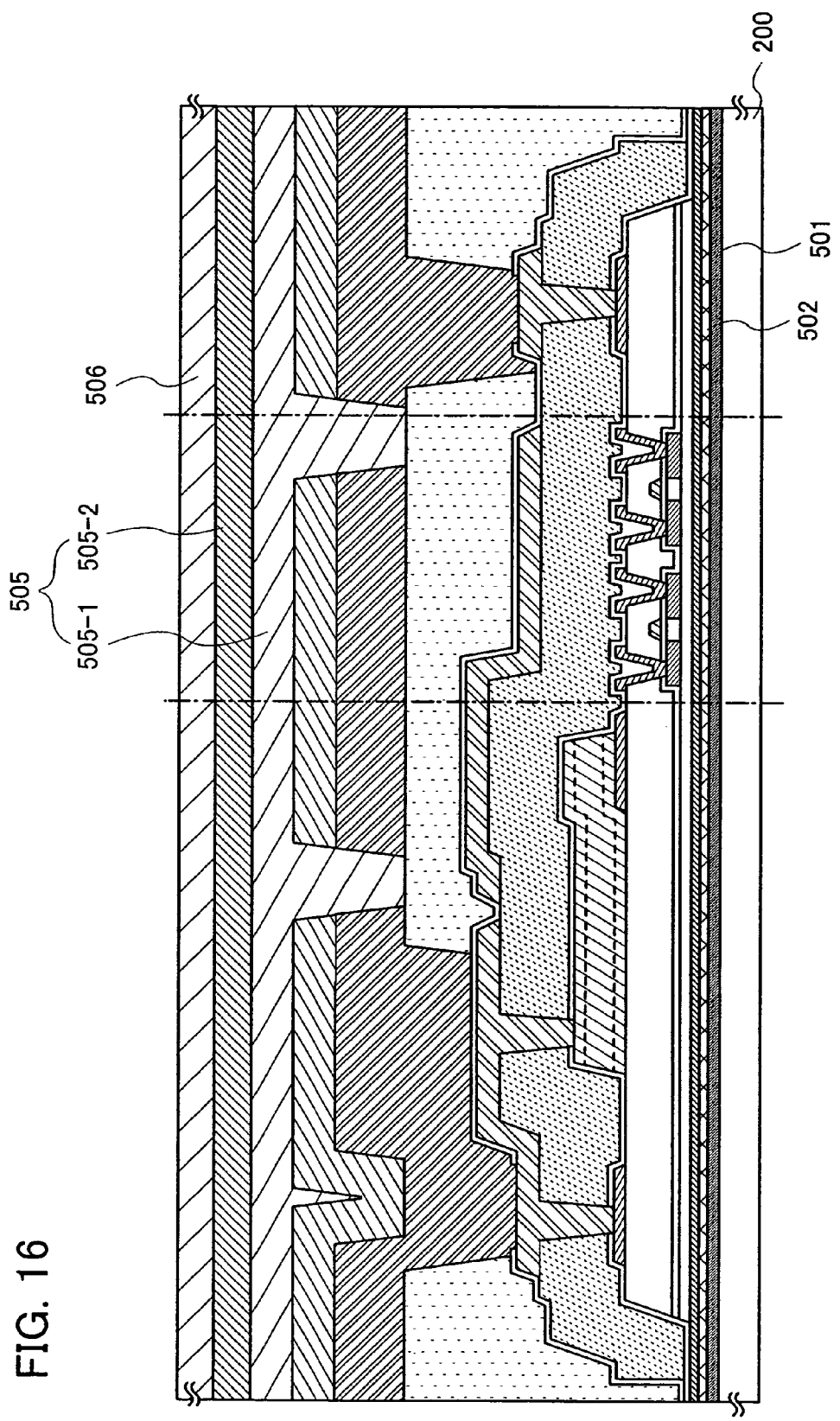

SEMICONDUCTOR DEVICE AND ELECTRONIC DEVICE

BACKGROUND OF THE INVENTION

1. Field of the Invention

The present invention relates to a semiconductor device that has a photovoltaic element.

2. Description of the Related Art

There are many known photovoltaic devices used in the detection of electromagnetic waves, in general, for example, an object, generally called a light sensor, that is sensitive to light from the ultraviolet region to the infrared region of the electromagnetic spectrum. Out of these light sensors, one that has sensitivity in the visible light region, wavelength in the range from 400 nm to 700 nm, is called a visible light sensor, in particular, and visible light sensors are being used in many different kinds of devices for brightness adjustment, on/off control, and the like that are needed in a person's living environment.

In particular, in a display device, the brightness of ambient light around the display device is detected, and the luminance of the display is adjusted. Because the brightness of ambient light is detected, optimal luminance for the display can be obtained, and accordingly, the amount of electric power that is wasted can be reduced. These kinds of light sensors, which are used to adjust the luminance of a display, are used, for example, in cellular phones and personal computers.

Moreover, not only is the brightness of ambient light detected, the luminance of the display device and a backlight of a liquid crystal display device, in particular, is detected by a light sensor, and the luminance of the display screen is adjusted, as well.

In this kind of light sensor, a photodiode is used in a sensing portion, and the output current of the photodiode is amplified by an amplifier circuit. For this kind of amplifier circuit, a current mirror circuit, for example, is used (for an example, refer to Patent Reference Document 1).

Furthermore, in this kind of semiconductor integrated circuit, there are problems caused by static electricity generated while the semiconductor integrated circuit is being manufactured or being used in that the electrode and the semiconductor element are damaged and the reliability of the semiconductor element is decreased. In order to prevent damage due to electrostatic discharge from occurring in the semiconductor element and the electrode, a protective circuit connected to the terminal is fabricated along with the semiconductor element, and a high electric potential generated in the terminal is prevented from being applied to the semiconductor element by the protective circuit.

Patent Reference Document 1: Japanese Patent No. 3444093

SUMMARY OF THE INVENTION

However, in conventional light sensors, no countermeasures have been taken to protect against damage due to electrostatic discharge. Furthermore, problems arise in that the output of the light sensor is affected, the size of the light sensor itself is further increased, and the like with provision of a protective circuit.

In view of the above problems, the present invention has the objective of preventing damage due to electrostatic discharge in a semiconductor device that functions as a light sensor. In addition, the present invention also has an objective of preventing damage due to electrostatic discharge without any increase in the size of the semiconductor device.

The present invention is a semiconductor device that can function as a light sensor and has a photovoltaic element and a circuit to which is input the output of the photovoltaic element. The present invention is used to prevent the occurrence of damage due to electrostatic discharge in a light sensor by provision of a portion in which damage due to electrostatic discharge occurs more readily than in a portion that functions substantially as a light sensor.

One semiconductor device of the present invention has a photovoltaic element; a circuit that is electrically connected to the photovoltaic element; a first terminal that is electrically connected to the photovoltaic element; a second terminal that is electrically connected to the circuit; and a conductive film, formed adjacent to the first terminal and the second terminal, that is not electrically connected to the photovoltaic element or to the circuit; where the area of the conductive film is larger than both the area of the first terminal and the area of second terminal. Moreover, it is more desirable that the area of the conductive film be not less than twice a larger area of the areas of the first and second terminals. A phrase "an area" in the present specification means "an area of an upper surface".

By formation of a conductive film, whose area is larger than that of a terminal that is electrically connected to the photovoltaic element or the circuit, adjacent to the terminal, the probability of damage due to electrostatic discharge occurring in the conductive film becomes greater than the probability of damage due to electrostatic discharge occurring in the terminal. Even if damage due to electrostatic discharge occurs in the conductive film, because this conductive film is not electrically connected to any one of the terminal, the photovoltaic element, or the circuit, there is no damage due to electrostatic discharge in the terminal, the photovoltaic element, or the circuit. In a case where the conductive film (a dummy electrode) is in a floating state, charge can be accumulated in the conductive film. Also, in a case where the conductive film is electrically connected to a substrate such as a printed circuit board (PCB), it is possible to accumulate charge or to transfer charge to the substrate.

By the conductive film being provided so as to overlap with the circuit with an insulating film interposed therebetween, damage due to electrostatic discharge can be prevented without any increase in the size of the semiconductor device.

Furthermore, by a reflective film being used for the conductive film, the conductive film can be formed so as to overlap with the photovoltaic layer of the photovoltaic element. In this case, the conductive film functions as a reflective plate. As a consequence, because light passing through the photovoltaic layer can be reflected by the conductive film, the photovoltaic efficiency of the photovoltaic element can be improved.

In the present invention, by use of a conductive film, which is a means that has a simple structure, the occurrence of damage due to electrostatic discharge in a semiconductor device that has a photovoltaic element can be prevented.

BRIEF DESCRIPTION OF THE DRAWINGS

FIGS. 5A to 5C are cross-sectional-view diagrams used to describe a manufacturing method of a semiconductor device of the present invention.

FIGS. 6A and 6B are cross-sectional-view diagrams used to describe a manufacturing method of a semiconductor device of the present invention.

FIG. 7 is a cross-sectional-view diagram used to describe a manufacturing method of a semiconductor device of the present invention.

FIG. 8 is a cross-sectional-view diagram showing an example of a structure of a semiconductor device of the present invention.

FIGS. 10A to 10C are cross-sectional-view diagrams used to describe a manufacturing method of a semiconductor device of the present invention.

FIGS. 15A and 15B are cross-sectional-view diagrams used to describe a manufacturing method of a semiconductor device of the present invention.

FIG. 16 is a cross-sectional-view diagram showing an example of a structure of a semiconductor device of the present invention.

DETAILED DESCRIPTION OF THE INVENTION

Figure 1:
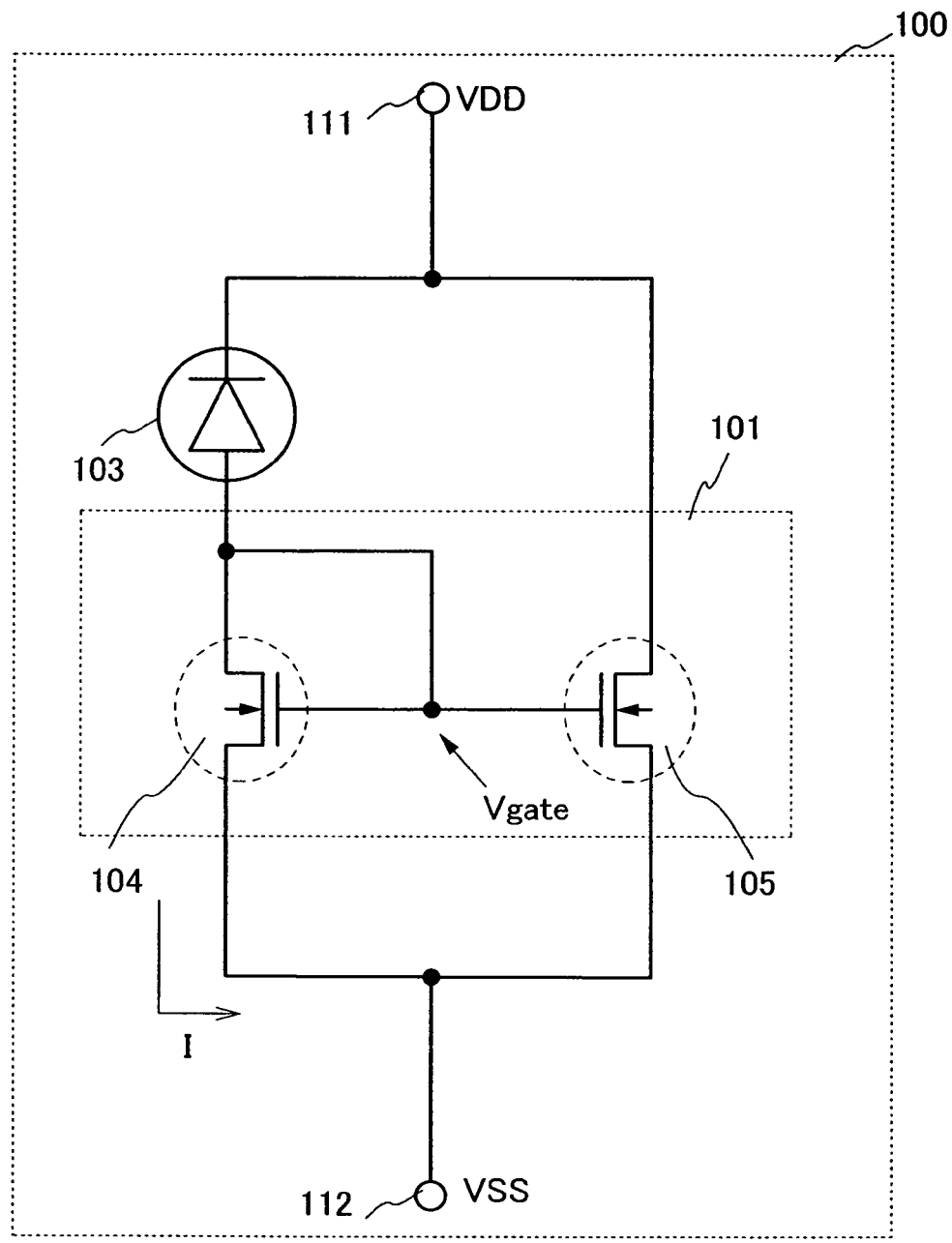
FIG. 1 is a schematic diagram illustrating an example of a structure of a semiconductor device of the present invention.

Hereinafter, Embodiment Modes of the present invention will be described based on drawings. However, the present invention can be implemented in a lot of different modes, and it is to be easily understood by those skilled in the art that various changes and modifications can be made without any departure from the spirit and scope of the present invention. Accordingly, the present invention is not to be taken as being limited to the described content of the embodiment modes included herein. It is to be noted that identical portions or portions having similar functions in all figures used to describe embodiment modes are denoted by the same reference numerals, and repetitive description thereof is omitted.

Embodiment Mode 1

Using FIG. 1, a semiconductor device of the present invention will be described. FIG. 1 is a schematic diagram illustrating an example of a structure of a semiconductor device of the present invention. In the present embodiment mode, an example of a semiconductor device that has a photodiode used as a photovoltaic element and a current mirror circuit used as a circuit that is connected to the photovoltaic element is described.

As shown in FIG. 1, a semiconductor device 100 of the present embodiment mode has a photodiode 103 and a current mirror circuit 101 that is electrically connected to the photodiode 103. The current mirror circuit 101 is a circuit that is used to amplify the output of the photodiode 103 and is formed of a transistor 104 on the reference side and a transistor 105 on the output side. In FIG. 1, the transistor 104 and the transistor 105 are set to be n-channel transistors. Both the transistor on the output side of the current mirror circuit and the transistor on the reference side of the current mirror circuit can be formed using p-channel transistors, as well.

Furthermore, the semiconductor device 100 has two terminals (a first terminal 111 and a second terminal 112) that are each connected to a power supply (bias power supply). The first terminal 111 is an electrode used to connect to a high voltage electric potential ($V_{DD}$) that is connected to a high voltage electric potential of a power supply, and the second terminal 112 is an electrode used to connect to a low voltage electric potential ($V_{SS}$) that is connected to a low voltage electric potential of a power supply.

A method of operation for the semiconductor device shown in FIG. 1 will be described. The first terminal 111 is connected to the high voltage electric potential ($V_{DD}$) of a power supply, and the second terminal 112 is connected to the low voltage electric potential ($V_{SS}$) of a power supply. By application of the same voltage, a voltage $V_{gate}$, to a gate of the transistor 104 on the reference side of the current mirror circuit 101 and to a gate of the transistor 105 on the output side of the current mirror circuit 101, a current I flowing through the transistor 104 on the reference side is set to be a reference current, and the amount of current flowing through the transistor 105 on the output side is controlled. Because the current I that flows through the transistor 104 corresponds to the current that is detected by the photodiode 103, the output current of the photodiode 103 can be detected by detection of the current flowing through the transistor 105.

It is to be noted that, in FIG. 1, one transistor is shown for the transistor 105 on the output side; however, the transistor 105 on the output side may be formed as a plurality of transistors, where the gate of each of the plurality of the transistors 105 on the output side is connected to the gate of the transistor 104 on the reference side. The output current (photovoltaic current) of the photodiode 103 is amplified in response to the number of transistors on the output side. For example, if the output of the photodiode 103 is to be multiplied by a factor of 100, one hundred of the transistors 105 may be connected in parallel with respect to one transistor 104.

Furthermore, in FIG. 1, one transistor is shown for the transistor 104 on the reference side; however, the transistor 104 on the reference side may be formed of a plurality of transistors, where the gate of each of the plurality of the transistors 104 on the reference side is connected to the gate of the transistor 105 on the output side. The output current (photovoltaic current) of the photodiode 103 is attenuated in response to the number of transistors on the reference side. For example, if the output of the photodiode 103 is to be multiplied by a factor of 1/100, one hundred of the transistors 104 may be connected in parallel with respect to one transistor 105.

Figure 2:
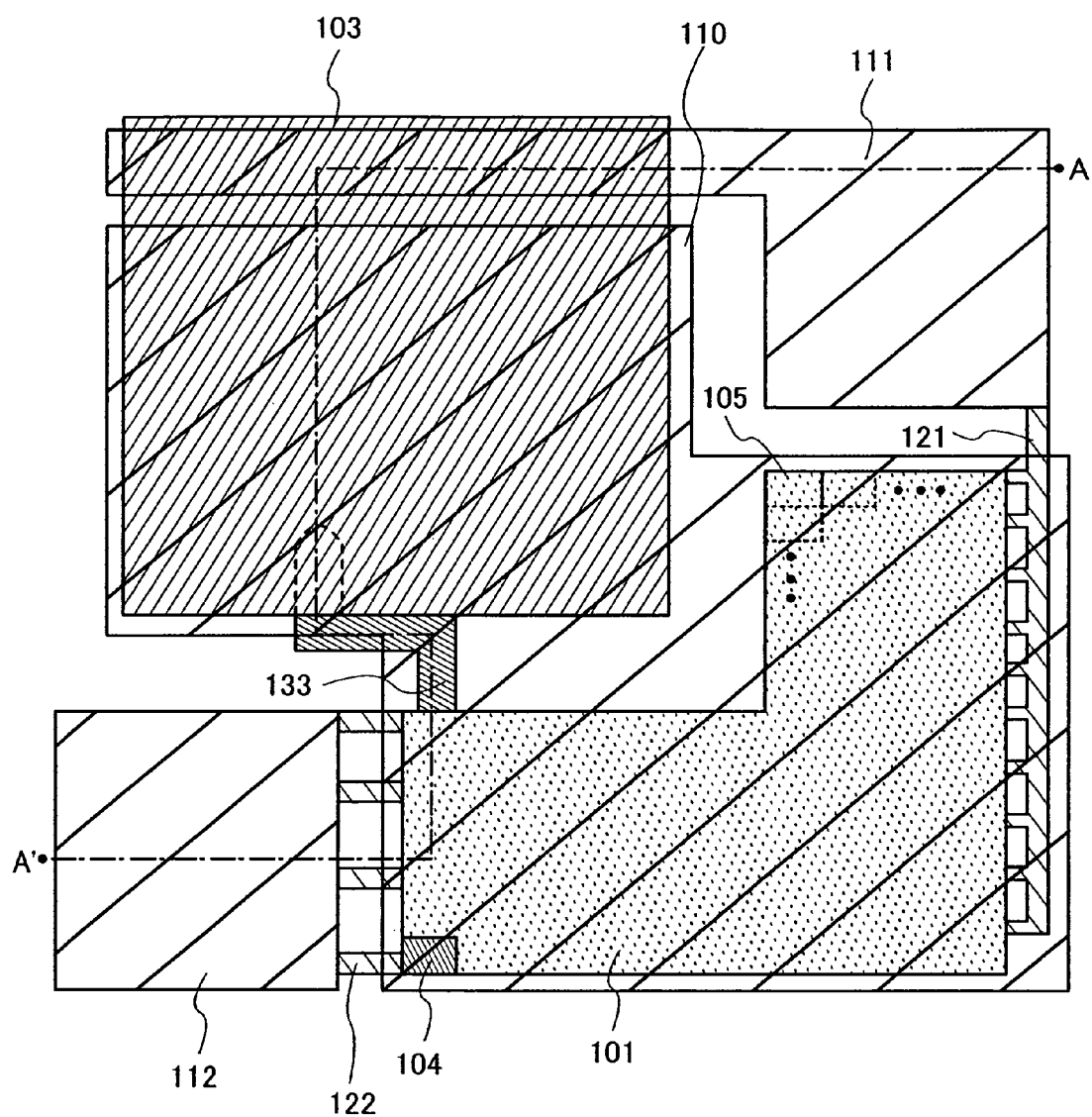
FIG. 2 is a plane-view diagram, corresponding to the schematic diagram of FIG. 1, illustrating an example of a layout of a semiconductor device of the present invention.
Figure 3:
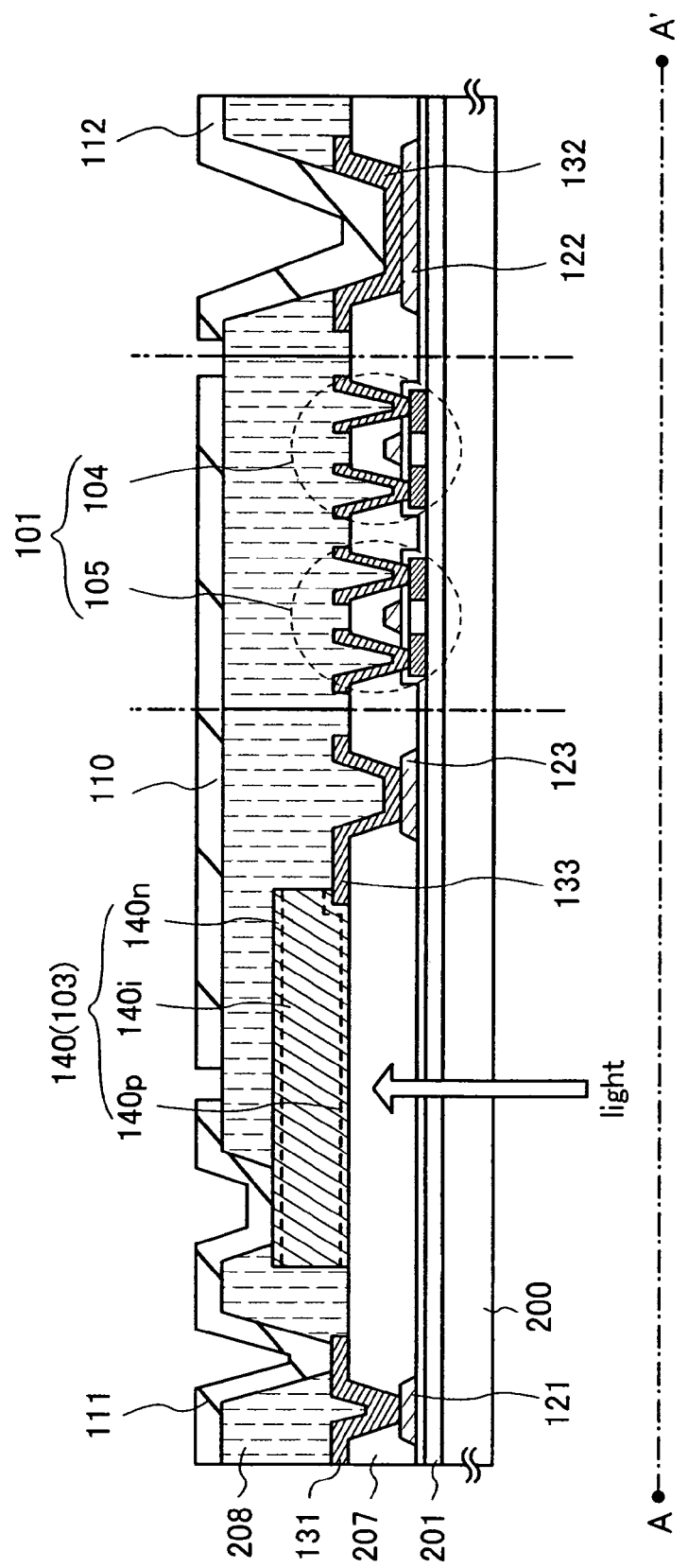
FIG. 3 is a diagram used to describe the structure of a cross section of a semiconductor device of the present invention.

In FIG. 2, a plane-view diagram illustrating an example of a layout of the semiconductor device 100 of FIG. 1 is shown. In FIG. 3, a diagram used to describe the structure of a cross section of the semiconductor device 100 is shown. In FIG. 2 and FIG. 3, the same reference numerals as those in FIG. 1 indicate elements that have the same structure as those in FIG. 1. A dash line A-A' in FIG. 3 corresponds to a cross-sectional view taken along the line A-A' in FIG. 2.

As shown in FIG. 2, the current mirror circuit 101, the photodiode 103, the first terminal 111, and the second terminal 112 are located within a rectangular region. The current mirror circuit 101 has one transistor 104 on the reference side and a plurality of transistors 105 on the output side.

As shown in FIG. 2, a wiring 121 used to electrically connect the current mirror circuit 101 and the first terminal 111, a wiring 122 used to electrically connect the current mirror circuit 101 and the second terminal 112, and a wiring 133 used to electrically connect the photodiode 103 and the current mirror circuit 101 are provided in the semiconductor device 100.

Furthermore, a dummy electrode 110 that is formed of a conductive film is placed adjacent to the first terminal 111 and the second terminal 112 and placed in the semiconductor device 100 so as to overlap with the current mirror circuit 101 and the photodiode 103. The dummy electrode 110 is also arranged so as to be adjacent to the first terminal 111 and the second terminal 112, and the area of the dummy electrode 110 is larger than both the area of the first terminal 111 and the area of the second terminal 112. The conductive film of which the dummy electrode 110 is formed is not electrically connected to the current mirror circuit 101 or the photodiode 103. That is, the dummy electrode 110 is not connected to the circuit shown in FIG. 1 but is a conductive film whose electric potential is in a floating state. By this dummy electrode 110, the occurrence of damage due to electrostatic discharge in the semiconductor device 100 can be prevented.

FIG. 3 is a cross-sectional-view diagram of an example of a structure of the semiconductor 100 when the current mirror circuit 101 is formed of top-gate n-channel thin film transistors (TFTs). In FIG. 3, an example where the transistors 104 and 105 are TFTs with a structure that has one channel formation region (referred to as "a single-gate structure" in the present specification) is shown; however, either one of the transistors 104 and 105 can be set to have a structure with a plurality of channel formation regions (a multi-channel structure). If one of the transistors 104 and 105 is set to have a multi-channel structure, the amount of variation in on current can be decreased.

Moreover, in order to reduce off current, a low concentration drain (lightly doped drain (LDD)) region may be provided in the transistor 104 or the transistor 105. An LDD region is a region that is doped with an impurity element at a low concentration and is located between a channel formation region and a source region or drain region that is doped with an impurity element at a high concentration. By provision of an LDD region, there is an effect in that degradation of the transistor due to hot carrier injection where the electric field in the periphery of the drain region is reduced can be prevented.

In addition, in order to prevent the on current from decreasing due to the injection of hot carriers, either the transistor 104 or the transistor 105 may be set to have a structure in which a gate electrode is overlapped with an LDD region with a gate insulating film interposed therebetween (referred to as a gate-drain overlapped LDD (GOLD) structure in the present specification).

By the structure of the transistor 104 or the transistor 105 being set to be a GOLD structure, because electric field concentration effects in the periphery of the drain region are decreased, the effect in prevention of degradation of the transistor due to hot carrier injection is higher with a transistor that has a GOLD structure than with a transistor that has a structure in which the gate electrode does not overlap with the LDD region.

Furthermore, the transistor 104 and the transistor 105 of the current mirror circuit 101 need not be formed as only top-gate TFTs but may also be formed as bottom-gate TFTs, for example, as inverse-staggered TFTs.

As shown in FIG. 3, the transistors 104 and 105 of the current mirror circuit 101 are formed over a substrate 200, with an insulating layer 201 that functions as a base film interposed between the transistors 104 and 105 and the substrate 200. A glass substrate, a plastic substrate, or the like can be used for the substrate 200. As shall be described hereafter, the substrate 200 can be set to be a different substrate than the substrate used at the time of manufacture of the transistors 104 and 105.

The wiring 121 that is used to electrically connect the current mirror circuit 101 to the first terminal 111, the wiring 122 that is used to electrically connect the current mirror circuit 101 to the second terminal 112, and a wiring 123 that is used to electrically connect the current mirror circuit 101 to the photodiode 103 are formed over the insulating layer 201. These wirings 121 to 123 are formed from the same conductive film and by the same process as the gate electrodes of the transistors 104 and 105 or the gate wiring of the transistors 104 and 105.

An insulating layer 207 is formed so as to cover the gate electrodes of the transistors 104 and 105 and the wirings 121 to 123. The insulating layer 207 functions as an interlayer insulating film.

A wiring 131 used to electrically connect source electrodes and drain electrodes of the transistors 104 and 105 and the current mirror circuit 101 to the first terminal 111, a wiring 132 used to electrically connect the current mirror circuit 101 to the second terminal 112, and the wiring 133 used to electrically connect the current mirror circuit 101 and the photodiode 103 to each other are formed over the insulating layer 207. These wirings 131 to 133 are formed from the same conductive film and by the same process.

Moreover, a photovoltaic layer 140 that functions as the photodiode 103 is formed over the insulating layer 207. The photovoltaic layer 140 is formed of semiconductor layers that have a PIN junction. In the photovoltaic layer 140 shown in FIG. 3, a p-type semiconductor layer 140$p$, an i-type semiconductor layer 140$i$, and an n-type semiconductor layer 140$n$ are formed and stacked, in the order given, starting from the insulating layer 207 side. The p-type semiconductor layer 140$p$ of the photovoltaic layer 140 is formed so as to come into contact with the wiring 133. By use of this structure, the photodiode 103 and the current mirror circuit 101 are electrically connected to each other through the wiring 133 and the wiring 123.

An insulating layer 208 is formed to cover the wirings 131 to 133 and the photovoltaic layer 140 (the photodiode 103).

The insulating layer 208 is a sealing layer used to seal off the surfaces of the photodiode 103 and the current mirror circuit 101.

The dummy electrode 110, the first terminal 111, and the second terminal 112 are formed over the insulating layer 208. In the semiconductor device 100 in FIG. 3, insulating layers (the insulating layers 201, 207, and 208) are formed so that surfaces of conductive layers in the semiconductor device 100 other than the dummy electrode 110, the first terminal 111, and the second terminal 112 are not exposed. The dummy electrode 110, the first terminal 111, and the second terminal 112 are formed from the same conductive film and by the same process.

The first terminal 111 is electrically connected to the current mirror circuit 101 through the wiring 131 and the wiring 121. The second terminal 112 is electrically connected to the current mirror circuit 101 through the wiring 132 and the wiring 122. The dummy electrode 110 is formed so as to be adjacent to the first terminal 111 and the second terminal 112 and has a larger area than that of the first terminal 111 and that of the second terminal 112. Furthermore, the dummy electrode 110 is not electrically connected to any wiring or electrode in the semiconductor device 100.

In this way, because the dummy electrode 110 is formed adjacent to the first electrode 111 and the second electrode 112 and the area of the dummy electrode 110 is larger than both the area of the first terminal 111 and the area of the second terminal 112, the probability that damage due to electrostatic discharge will occur in the dummy electrode can be made to be higher than the probability that damage due to electrostatic discharge will occur in the first terminal 111 or in the second terminal 112. Also, it is more desirable that the area of the conductive film be not less than twice a larger area of the areas of the first and second terminals. Supposing that this is true, even if damage due to electrostatic discharge does occur in the dummy electrode 110, because the dummy electrode 110 is not electrically connected to any one of the current mirror circuit 101, the photodiode 103, the first terminal 111, or the second terminal 112, damage due to electrostatic discharge can be prevented from occurring in the semiconductor device 100.

In the layout example of FIG. 2, because the dummy electrode 110 is formed overlapping with the photovoltaic layer 140 (the photodiode 103), if the dummy electrode 110 is formed of a conductive film that reflects light, the dummy electrode 110 can be made to function as a reflective plate that reflects light passing through the photovoltaic layer 140. By provision of a reflective plate, because light reflected by the dummy electrode 110 can be sent back to the photovoltaic layer 140, the conversion efficiency of the photovoltaic layer 140 can be increased.

It is to be noted that, with the dummy electrode 110 being made to function as a reflective plate, there are cases where incoming light incident on the photovoltaic layer 140 and light reflected by the dummy electrode 110 interfere with each other and photovoltaic efficiency is decreased. In these cases, it is preferable that the dummy electrode 110 be formed so as not to overlap with the photovoltaic layer 140. An example of a layout of the semiconductor 100 for this case is shown in FIG. 4.

Figure 4:
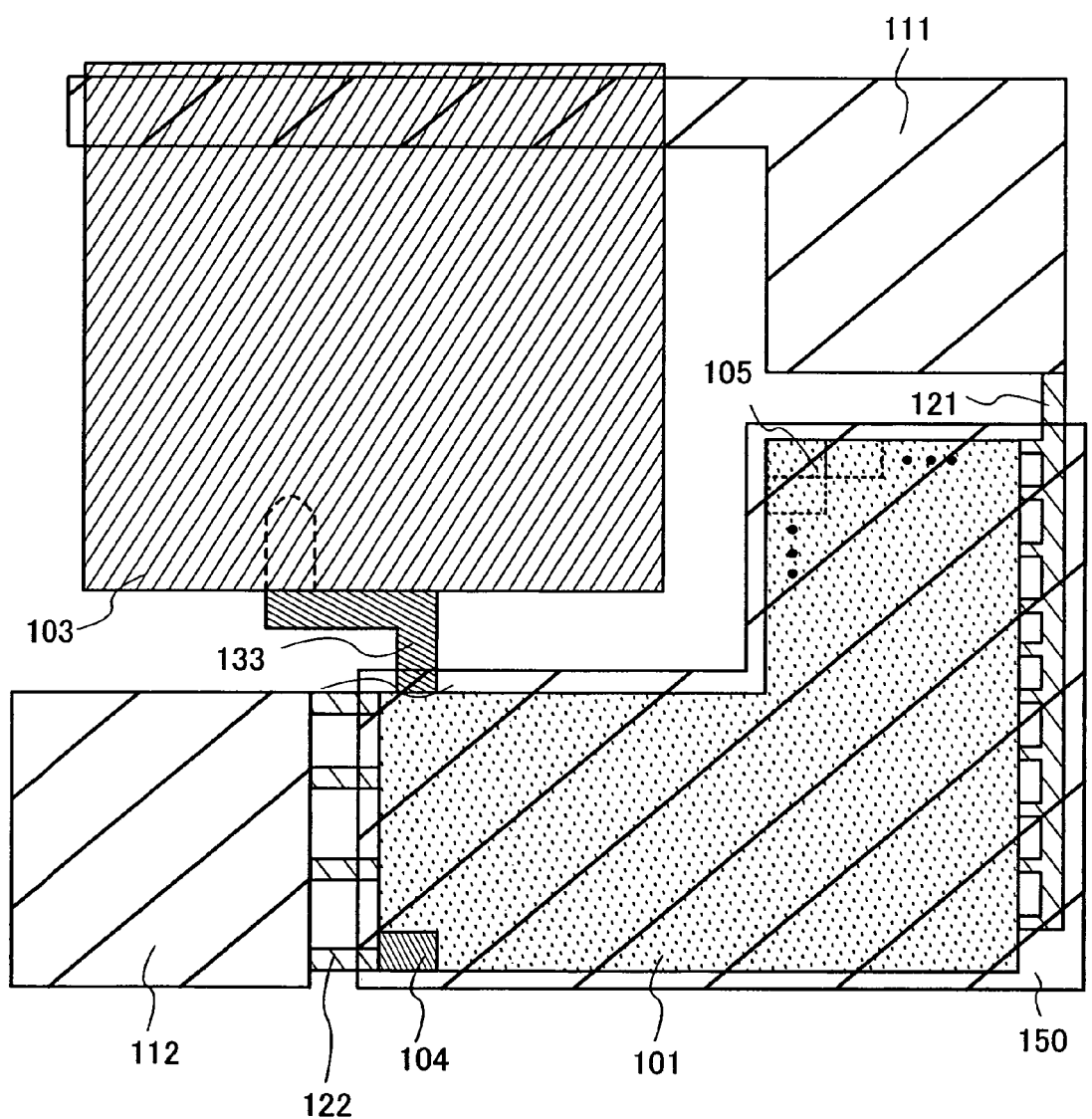
FIG. 4 is a plane-view diagram, corresponding to the schematic diagram of FIG. 1, illustrating an example of a layout of a semiconductor device of the present invention.

In the layout examples of FIG. 4 and FIG. 2, the structures are the same except for the shapes of the dummy electrodes. A dummy electrode 150 in FIG. 4 is formed so as not to cover the photodiode 103 and so as not to reflect light that passes through the photodiode 103 (the photovoltaic layer 140).

Next, using FIG. 3, FIGS. 5A to 5C, FIGS. 6A and 6B, and FIG. 7, a manufacturing method of the semiconductor device 100 that has the layout shown in FIG. 2 and the semiconductor device 100 that has the layout shown in FIG. 4 will be described.

First, the current mirror circuit 101 is formed over the substrate 200. For the substrate 200, for example, AN100, one type of glass substrate, can be used.

As shown in FIG. 5A, an insulating layer 201 (film thickness of from 50 nm to 200 nm) that acts as a base insulating layer is formed over the top surface of the substrate 200. A silicon oxide film (film thickness of from 50 nm to 150 nm) that contains nitrogen is formed for the insulating layer 201. For example, by a CVD method, a silicon nitride oxide film is formed at 50 nm and a silicon oxynitride film with a nitrogen concentration lower than that of the silicon nitride oxide film and with a high oxygen concentration is formed at 100 nm, and the two films are stacked together. It is to be noted that the insulating layer 201 may be formed as one layer or as a stacked-layer film of two or more layers. The silicon nitride oxide film that has a high nitrogen concentration or the silicon nitride film functions as a blocking layer used to prevent the diffusion of impurities, such as alkali metal or the like, from the glass substrate.

Next, a semiconductor layer for the transistor 104 and the transistor 105 are formed over the insulating layer 201. In the present embodiment mode, after a silicon oxide film is formed for the insulating layer 201, an amorphous silicon film (film thickness of from 10 nm to 60 nm) is formed such that the substrate 200 is not exposed to the atmosphere. Subsequently, the amorphous silicon film is crystallized to form a crystalline silicon film. For crystallization methods, a solid-phase growth method, a laser crystallization method, a crystallization method that uses a catalyst metal, or the like can be used. For example, the amorphous silicon film is irradiated with a continuous wave $YVO_4$ laser oscillating at the second harmonic, and the amorphous silicon film is completely melted by the laser beam and made to grow laterally.

After the surface of the obtained crystalline silicon film is treated with ozone water and a thin oxide film is formed thereover, a mask made from a resist using a photomask is formed, the crystalline silicon film is etched into a given shape, and a semiconductor layer 151 and a semiconductor layer 152 separated into island shapes are formed (refer to FIG. 5A). After the semiconductor layer 151 and the semiconductor layer 152 are formed, the mask that is made from a resist is removed.

Next, the semiconductor layer 151 and the semiconductor layer 152 are each doped with a trace amount of an impurity element (either boron or phosphorus) in order to control the threshold voltage of the transistor 104 and the transistor 105. It is to be noted that this doping step should be performed as necessary.

Next, after the oxide film is removed using an etchant that contains hydrofluoric acid and, simultaneously, the surface of each of the semiconductor layer 151 and the semiconductor layer 152 is washed, an insulating layer 203 is formed. The insulating layer 203 functions as a gate insulating film. For the insulating layer 203, for example, a silicon oxynitride film (element ratio of Si=32%, O=59%, N=7%, and H=2%) is formed at a thickness of 115 nm by a plasma CVD method.

Next, a conductive film is formed over the insulating layer 203, a mask made from a resist is formed over this conductive film, the conductive film is etched into a given shape using this mask, and a gate electrode 154, a gate electrode 155, and the wirings 121 to 123 are formed (refer to FIG. 5B).

For a conductive film forming the gate electrodes 154 and 155 and the wirings 121 to 123, a film formed of a metal selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu) or an alloy or metallic compound that contains a metal or metals selected from the any of the above metals as its main component can be used. The conductive film may be formed as a single layer or as a stacked-layer structure. For the conductive film, for example, a film of tantalum nitride formed at a thickness of 30 nm and tungsten formed at a thickness of 370 nm stacked together can be used.

Subsequently, in order to form source regions and drain regions, n-type impurity regions 156 are formed in the semiconductor layer 151 and n-type impurity regions 157 are formed in the semiconductor layer 152. By formation of the n-type impurity regions 156 and 157, a channel formation region 158 in the semiconductor layer 151 and a channel formation region 159 in the semiconductor layer 152 are established (refer to FIG. 5C).

Next, as shown in FIG. 6A, the insulating layer 207 is formed. In the present embodiment mode, the insulating layer 207 is set to have a three-layer structure. First, a silicon oxide film is formed at a thickness of 50 nm by a CVD method. Next, an activation step is performed to activate the impurities with which the semiconductor layers 151 and 152 have been doped. For this activation step, a rapid thermal annealing method (RTA method) using a lamp light source, an irradiation method in which a film is irradiated from its back surface by a YAG laser or an excimer laser, or heat treatment using a furnace can be used.

For the second layer, a silicon nitride oxide film whose nitrogen concentration is higher than that of the first layer is formed at a thickness of 10 nm. For the third layer, a silicon oxide film is formed at a thickness of 900 nm. Alternatively, an insulating film derived from siloxane can be formed for the third layer of the insulating layer 207. The third layer of the insulating layer 207 should be formed as necessary.

Next, a mask made from a resist is formed, the insulating layer 207 and the insulating layer 203 are etched as selected, and a contact hole is formed. After that, the mask made from a resist is removed. Subsequently, a conductive film is formed over the insulating layer 207 by a sputtering method, and a mask made from a resist is formed over the conductive film. The conductive film is etched using this mask, the conductive film is formed into a given shape, and, as shown in FIG. 6A, the wirings 131 to 133 and electrodes 134 of the transistors 104 and 105 are formed. Each of the electrodes 134 functions as a source electrode or drain electrode of a transistor.

The conductive film forming the wirings 131 to 133 and the electrodes 134 may be formed as a single layer or as a stacked-layer structure. For the conductive film, with regard to heat resistance, conductivity, and the like, it is preferable that a titanium (Ti) film be used. As an alternative to a titanium film, a metal film formed of tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum (Pt); an alloy film that contains at least one of these metals as its main component; or a metallic compound film can be used. Furthermore, an aluminum film or an aluminum alloy film can also be used for the conductive film.

In addition, a protective conductive layer may be formed to cover the wirings 131 to 133 and the electrodes 134. Using FIG. 6B, a formation method of the protective conductive film will be described. After the wirings 131 to 133 and the electrodes 134 are formed, a conductive film forming the protective conductive layer is formed. By an etching process, this conductive film is formed into a given shape, and a protective conductive layer 137 to cover the wirings 131 to 133 and the electrodes 134 is formed, as shown in FIG. 6B.

For the material of the protective conductive layer 137, it is preferable that a conductive material where the etching rate of a gas (or an etchant) used to etch the photovoltaic layer 140 is lower for the conductive material than for the photovoltaic layer 140 be used. In addition, it is preferable that a conductive material that does not react with the photovoltaic layer 140 to form an alloy be used for the material of the protective conductive layer 137.

For example, for the protective conductive layer 137, titanium (Ti) or molybdenum (Mo), neither of which readily reacts with the photovoltaic layer 140 (which is typically formed of amorphous silicon) to form an alloy, can be used. It is preferable that an aluminum film or an aluminum alloy film be formed for the wiring 133 because these films have low resistance; however, these films react with amorphous silicon of which the photovoltaic layer 140 is formed. Consequently, with formation of the protective conductive layer 137, the wiring 133 can be formed of an aluminum film or an aluminum alloy film, both of which have low resistance.

After the wirings 131 to 133 and the electrodes 134 are formed, as shown in FIG. 7, the photovoltaic layer 140 that has a PIN junction is formed over the insulating layer 207. In the present embodiment mode, the photovoltaic layer 140 is formed of a stacked structure of the p-type semiconductor layer 140$p$, the i-type semiconductor layer 140$i$, and the n-type semiconductor layer 140$n$. In FIG. 7, the lowest layer (the p-type semiconductor layer 140$p$) of the photovoltaic layer 140 is formed so as to come into contact with the wiring 133. It is to be noted that, when the protective conductive layer 137 is formed, the protective conductive layer 137 comes into contact with the lowest layer of the photovoltaic layer 140.

The photovoltaic layer 140 is formed as a three-layer structure in which each layer is formed of a semiconductor layer, and the three semiconductor layers are each formed into a given shape by etching. The p-type semiconductor layer 140$p$ may be formed of an amorphous silicon film that contains an impurity element from group 13 of the periodic table of the elements, for example, boron (B), by a plasma CVD method. The i-type semiconductor layer 140$i$ may be formed of an amorphous silicon film by a plasma CVD method, for example. The n-type semiconductor layer 140$n$ may be formed of an amorphous silicon film that contains an impurity element from group 15 of the periodic table of the elements, for example, phosphorus (P), and the impurity element from group 15 of the periodic table of the elements may be introduced after the amorphous silicon film is formed.

Next, as shown in FIG. 7, the insulating layer 208 that is used as a sealing layer is formed. For example, a silicon oxynitride film is formed at a film thickness of 1 μm. By use of an insulating film formed by a CVD method, an improvement in adhesiveness can be obtained.

Subsequently, the insulating layer 208 is etched to form a contact hole. Next, a conductive film is formed over the insulating layer 208. This conductive film is formed into a given shape by etching, and the dummy electrode 110, the first terminal 111, and the second terminal 112 as shown in FIG. 3 are formed. The first terminal 111 and the second terminal 112 are each set to be, for example, a stacked-layer film of a titanium film (Ti film, thickness of 100 nm), a nickel film (Ni film, thickness of 300 nm), and a gold film (Au film, thickness of 50 nm). The adhesive strength of the first terminal 111 and that of the second terminal 112 formed of this conductive film each exceeds 5 N, which is enough adhesive strength for a terminal electrode.

By the above steps, the semiconductor device 100 that functions as a light sensor is formed over the substrate 200. It is to be noted that, because a plurality of the semiconductor devices 100 is formed over the substrate 200, the plurality of semiconductor devices 100 is separated into individual devices and set to be a plurality of light sensor chips. The size of each light sensor chip is about 2 mm by 1.5 mm. By use of the dummy electrode 110 of the present invention, the occurrence of damage due to electrostatic discharge in the semiconductor device 100 can be prevented without any increase in the size of these chips. To electrically connect one of the obtained light sensor chips (the semiconductor device 100) to another circuit or to a power supply, solder, a conductive paste, a solder bump, or the like can be formed in the first terminal 111 and the second terminal 112.

Furthermore, in order to make the light sensor chip thinner, it is preferable that the substrate 200 be made thinner by a polishing process or a grinding process. In this case, after the substrate 200 is made thinner, the substrate 200 is cut.

In addition, the substrate 200 used during production of the semiconductor device 100 can be separated from the insulating layer 201, and the semiconductor device 100 can be transferred to a bendable plastic substrate that is thinner than a glass substrate. In this case, a peeling layer in which separation readily occurs is formed between the substrate 200 and the insulating layer 201. After the dummy electrode 110, the first terminal 111, and the second terminal 112 are formed, the substrate 200 is separated from the photodiode 103 and the current mirror circuit 101 by a step in which separation is made to occur at the peeling layer.

After the substrate 200 and the insulating layer 201, which is the base, are separated from each other, the insulating layer 201 is attached to a substrate by use of an adhesive layer. For this substrate, a flexible substrate, such as a plastic substrate or the like, can be used.

The peeling layer can be formed of, for example, a metal film or an alloy film. For a metal film, a film formed of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like can be used. For an alloy film, a film formed of a plurality of metal elements selected from any of these metal elements, such as a film formed of an alloy of tungsten and molybdenum, can be used. These metal films and alloy films can be formed by a sputtering method. In addition, the metal film or alloy film to be used for the peeling layer should be formed at a thickness of less than or equal to 20 nm and greater than or equal to 100 nm.

In order that separation between the insulating layer 201 and the peeling layer occur preferentially, the surface of the metal film or alloy film formed for the peeling layer is oxidized. For methods of oxidation of the peeling layer, there is a thermal oxidation method, a method in which a surface is treated with oxygen or an $N_2O$ plasma, a method in which a surface is treated with a highly oxidative solution such as ozone water or the like, and the like. Furthermore, for an alternative method, there is a method in which, when the insulating layer 201 is formed, an oxide is formed in the interface between the insulating layer 201 and the peeling layer. For example, with an oxide of silicon that is formed by a sputtering method, if the oxide of silicon is deposited on the surface of a metal film or alloy film, the surface of the metal film or alloy film can be oxidized. It is to be noted that the metal film or alloy film may be nitrided by plasma treatment or heat treatment instead of being oxidized.

Embodiment Mode 2

Figure 9:
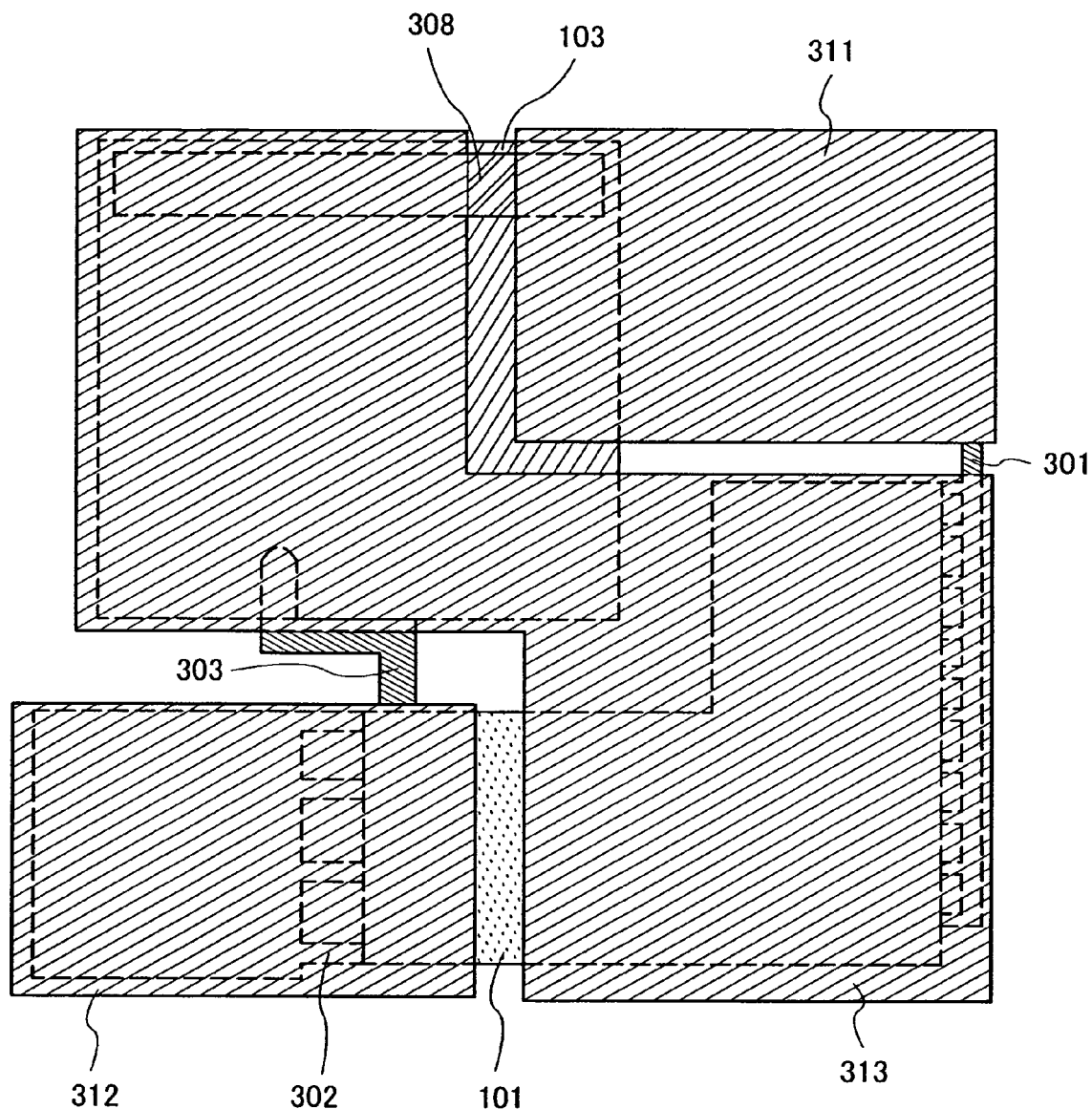
FIG. 9 is a plane-view diagram, corresponding to the cross-sectional-view diagram of FIG. 8, illustrating an example of a layout of a semiconductor device of the present invention.

In the present embodiment mode, another example of a structure of the semiconductor device 100 that is shown in FIG. 1 will be described. FIG. 8 is a diagram used to describe the structure of a cross section of the semiconductor device 100. FIG. 9 is a plane-view diagram used to describe an example of a layout of the semiconductor device 100.

FIG. 8, as with FIG. 3, is a cross-sectional-view diagram illustrating an example of the structure of the semiconductor device 100 when the current mirror circuit 101 is formed of top-gate n-channel TFTs. In FIG. 8, for the structure of a cross section of the current mirror circuit 101, the two transistors 104 and 105 that are provided in the current mirror circuit 101 are shown.

As shown in FIG. 8, the transistors 104 and 105 of the current mirror circuit 101 are formed over the substrate 200 with the insulating layer 201 that functions as a base film interposed between the transistors 104 and 105 and the substrate 200. In the present embodiment mode, the insulating layer 201 has a two-layer structure of a first insulating layer 201-1 and a second insulating layer 201-2.

An insulating layer 300 is formed to cover the semiconductor layer of the transistors 104 and 105 and the gate electrodes. The insulating layer 300 functions as an interlayer insulating layer.

A wiring 301 used to electrically connect the current mirror circuit 101 to the first terminal 111, a wiring 302 used to electrically connect the current mirror circuit 101 to the second terminal 112, a wiring 303 used to electrically connect the current mirror circuit 101 to the photodiode 103, and electrodes 304 of the transistors 104 and 105 are formed over the insulating layer 300.

Moreover, the photovoltaic layer 140 that functions as the photodiode 103 is formed over the insulating layer 300. The photovoltaic layer 140 is formed of semiconductor layers that have a PIN junction. In the photovoltaic layer 140 shown in FIG. 8, the p-type semiconductor layer 140p, the i-type semiconductor layer 140i, and the n-type semiconductor layer 140n are formed and stacked, in the order given, from the insulating layer 300 side. The p-type semiconductor layer 140p of the photovoltaic layer 140 is formed so as to come into contact with the wiring 303.

An insulating layer 306 is formed to cover the photovoltaic layer 140, the wirings 301 to 303, and the electrodes 304. An insulating layer 307 is formed over the photovoltaic layer 140 and the insulating layer 306, and an electrode 308 is formed over the insulating layer 307. The electrode 308 is electrically connected to the photovoltaic layer 140 through a contact hole that is formed in the insulating layer 307.

An insulating layer 309 is formed over the insulating layer 307 and the electrode 308. A first terminal 311, a second terminal 312, and a dummy electrode 313 are formed over the insulating layer 309. The first terminal 311, the second terminal 312, and the dummy electrode 313 are each formed of a conductive film 314 and a conductive film 315. The conductive films 314 and 315 are films with a single-layer structure or a stacked-layer structure of two or more layers. The first terminal 311, the second terminal 312, and the dummy electrode 313 are formed from the same conductive films and by the same process.

In the semiconductor device 100 in FIG. 8, insulating layers (the insulating layer 201, the insulating layer 300, and the insulating layer 309) are formed so that surfaces of conductive layers in the semiconductor device 100 other than the first terminal 311, the second terminal 312, and the dummy electrode 313 are covered so as not to be exposed to external.

The first terminal 311 is electrically connected to the current mirror circuit 101 via the wiring 301, and the second terminal 312 is electrically connected to the current mirror circuit 101 via the wiring 302 (refer to FIG. 9). As shown in FIG. 9, the dummy electrode 313 is formed adjacent to the first terminal 311 and the second terminal 312, and the area of the dummy electrode 313 is larger than both the area of the first terminal 311 and the area of the second terminal 312. Furthermore, the dummy electrode 313 is not electrically connected to any wiring or electrode in the semiconductor device 100.

In this way, because the dummy electrode 313 is formed adjacent to the first electrode 311 and the second electrode 312 and the area of the dummy electrode 313 is larger than both the area of the first terminal 311 and the area of the second terminal 312, the probability that damage due to electrostatic discharge will occur in the dummy electrode 313 can made to be higher than the probability that damage due to electrostatic discharge will occur in the first terminal 311 or in the second terminal 312. Supposing that this is true, even if damage due to electrostatic discharge does occur in the dummy electrode 313, because the dummy electrode 313 is not electrically connected to any one of the current mirror circuit 101, the photodiode 103, the first terminal 311, or the second terminal 312, damage due to electrostatic discharge can be prevented from occurring in the semiconductor device 100.

Next, a manufacturing method of the semiconductor device 100 shown in FIG. 8 will be described using FIGS. 10A to 10C. First, the steps of FIGS. 5A to 5C of Embodiment Mode 2 are performed, and the structure of FIG. 10A is obtained. It is to be noted that, in the present embodiment mode, the first insulating layer 201-1 forming the insulating layer 201 is formed of a silicon nitride oxide film at a thickness of from 50 nm to 150 nm, and a silicon oxynitride film with a lower nitrogen concentration than that of the first insulating film 201-1 and a high oxygen concentration is formed at a thickness of 100 nm for the second insulating film 201-2. Furthermore, neither the wiring 122 nor the wiring 123 is formed over the insulating layer 201. Next, as shown in FIG. 10B, the insulating layer 300 is formed. The insulating layer 300 can be formed in the same way as the insulating layer 207 of FIG. 6A is formed.

Subsequently, a mask made from a resist is formed, the insulating layer 300 and the insulating layer 203 are etched as selected, and a contact hole is formed. Furthermore, by etching, as shown in FIG. 10B, the end of the insulating layer 300 is formed into a tapered shape. With this etching process, the insulating layer 203 and the second insulating layer 201-2 are etched, as well. After the etching process is completed, the mask made from a resist is removed.

Next, a conductive film is formed over the insulating layer 300 by a sputtering method. This conductive film can be formed in the same way as the conductive film forming the wirings 131 to 134 of FIG. 6A is formed. A mask made from a resist is formed over the conductive film. The conductive film is etched using this mask and formed into a given shape, and, as shown in FIG. 10B, the wirings 301, 302, and 303 and the electrodes 304 of the transistors 104 and 105 are formed. Each of the electrodes 304 functions as a source electrode or drain electrode of a transistor.

Next, as shown in FIG. 10B, the photovoltaic layer 140 that has a PIN junction is formed over the insulating layer 300. Then, the insulating layer 306 is formed over the entire surface of the substrate 200. It is preferable that the insulating layer 306 function as a passivation film of the photovoltaic layer 140 and the transistors 104 and 105. For example, the insulating layer 306 can be formed of a silicon nitride film at a thickness of from 80 nm to 150 nm by a plasma CVD method.

Next, as shown in FIG. 10C, the insulating layer 307 is formed in order to form the electrode 308 that is electrically connected to the photovoltaic layer 140. It is preferable that the insulating layer 307 be formed by a printing method; for example, the insulating layer 307 can be formed as a given shape by application of a resin paste material by a screen printing method or the like and by baking. For example, the insulating layer 307 can be formed of an epoxy resin. Next, after the contact hole is formed in the insulating layer 306, the electrode 308 is formed over the insulating layer 307. For example, the electrode 308 can be formed by application of a nickel paste to a given location by a printing method and by baking.

Next, as shown in FIG. 8, the insulating layer 309 is formed to cover the top surface of the substrate 200. It is preferable that the insulating layer 309 be a resin film that functions as a planarized film. In addition, it is preferable that the insulating layer 309 be formed by a screen printing method or an inkjet printing method. By use of one of these methods, a contact hole can be formed in the insulating layer 309 without any use of an etching process. For example, the insulating layer 309 can be formed of an epoxy resin by a screen printing method.

Next, as shown in FIG. 8, the conductive films 314 that form the first terminal 311, the second terminal 312, and the dummy electrode 313 are formed. These conductive films 314 can be formed in the same way as the electrode 308 is formed. Next, the conductive films 315 that form the first terminal 311, the second terminal 312, and the dummy electrode 313 are formed. Here, a three-layer conductive film is formed by a sputtering method, and the conductive films 315 are formed by etching of this conductive film that has a three-layer structure. The conductive films 315 can be formed, for example, of a stacked-layer film of a titanium film that has a thickness of from 100 nm to 200 nm, a nickel film that has a thickness of from 700 nm to 800 nm, and a gold film that has a thickness of from 40 nm to 60 nm. It is to be noted that the dummy electrode 313 can be formed using the conductive film 314 only.

By the above steps, the semiconductor device 100 shown in FIG. 8 and FIG. 9 can be manufactured.

Figure 11:
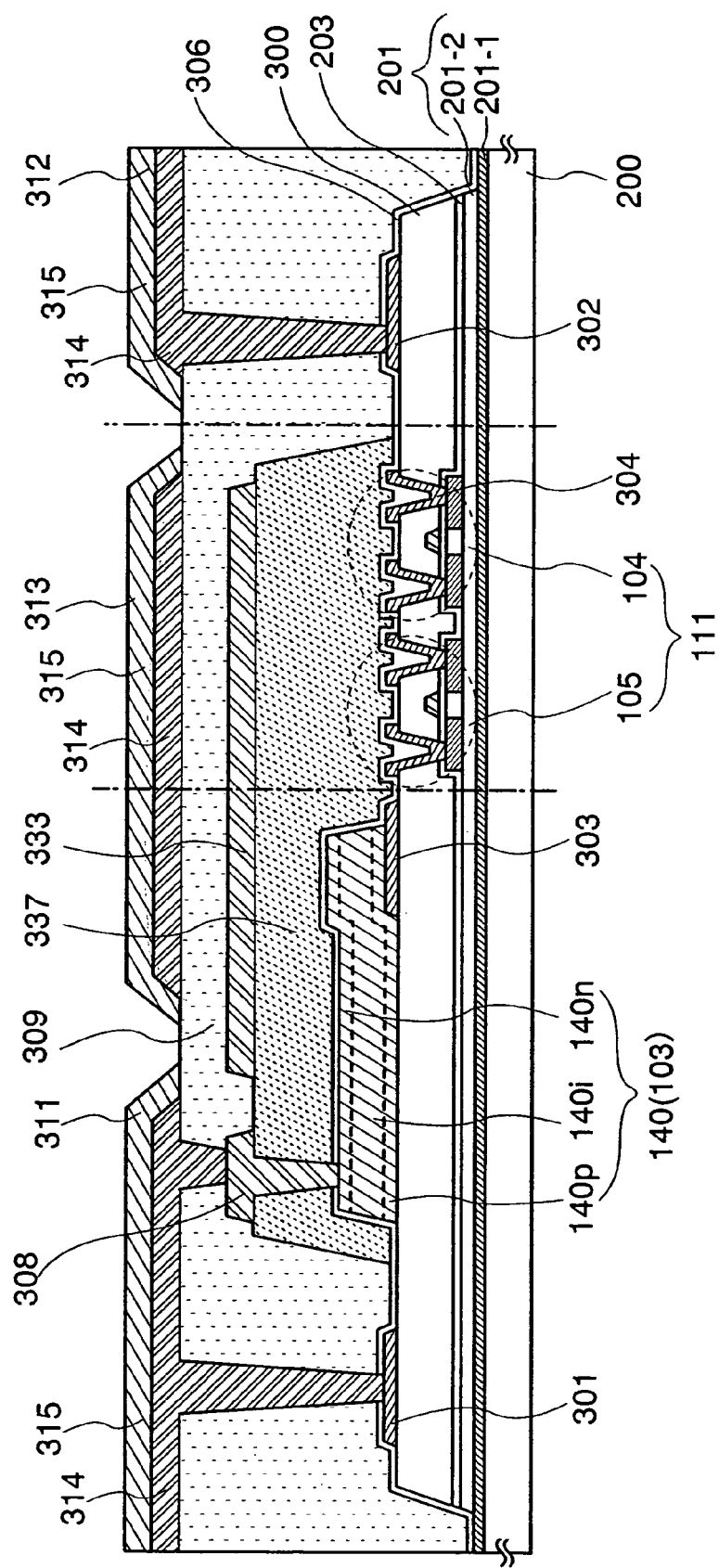
FIG. 11 is a cross-sectional-view diagram showing an example of a structure of a semiconductor device of the present invention.

It is to be noted that a different dummy electrode can be formed along with the electrode 308. A cross-sectional-view of the semiconductor device 100 that has this kind of dummy electrode is shown in FIG. 11. The point that differs from FIG. 8 is that an insulating layer 337 with a larger area than the area of the insulating layer 307 is formed in order to form a dummy electrode 333 along with the electrode 308 and that the dummy electrode 333 is formed over the top surface of this insulating layer 337. The dummy electrode 333, like the dummy electrode 313, is not electrically connected to any wiring or electrode in the semiconductor device 100. The dummy electrode 333 is formed with a larger area than both the area of the first terminal 311 and the area of the second terminal 312. It is to be noted that, when the dummy electrode 333 is formed, the dummy electrode 313 need not be formed.

Embodiment Mode 3

Figure 12:
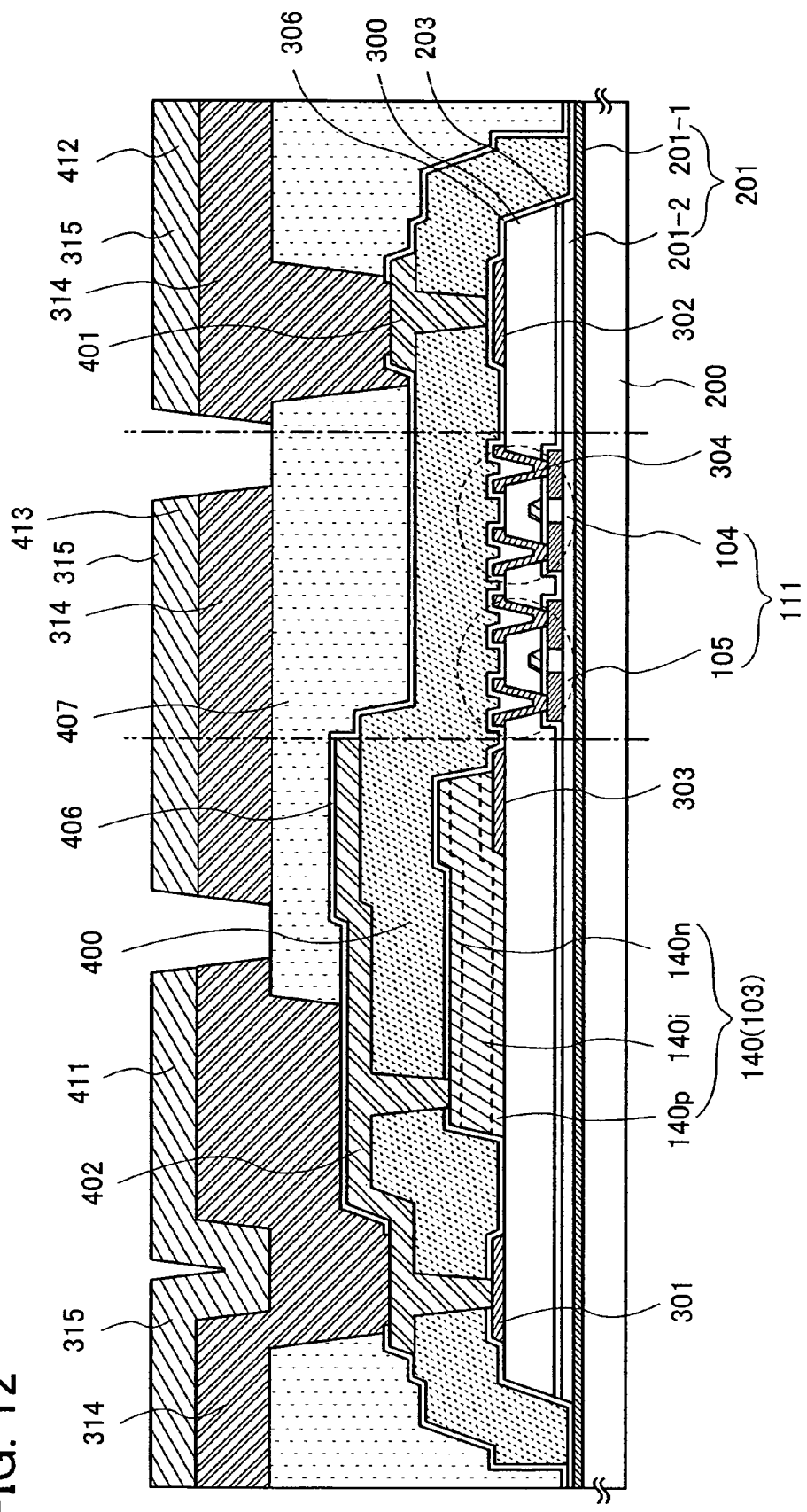
FIG. 12 is a cross-sectional-view diagram showing an example of a structure of a semiconductor device of the present invention.
Figure 13:
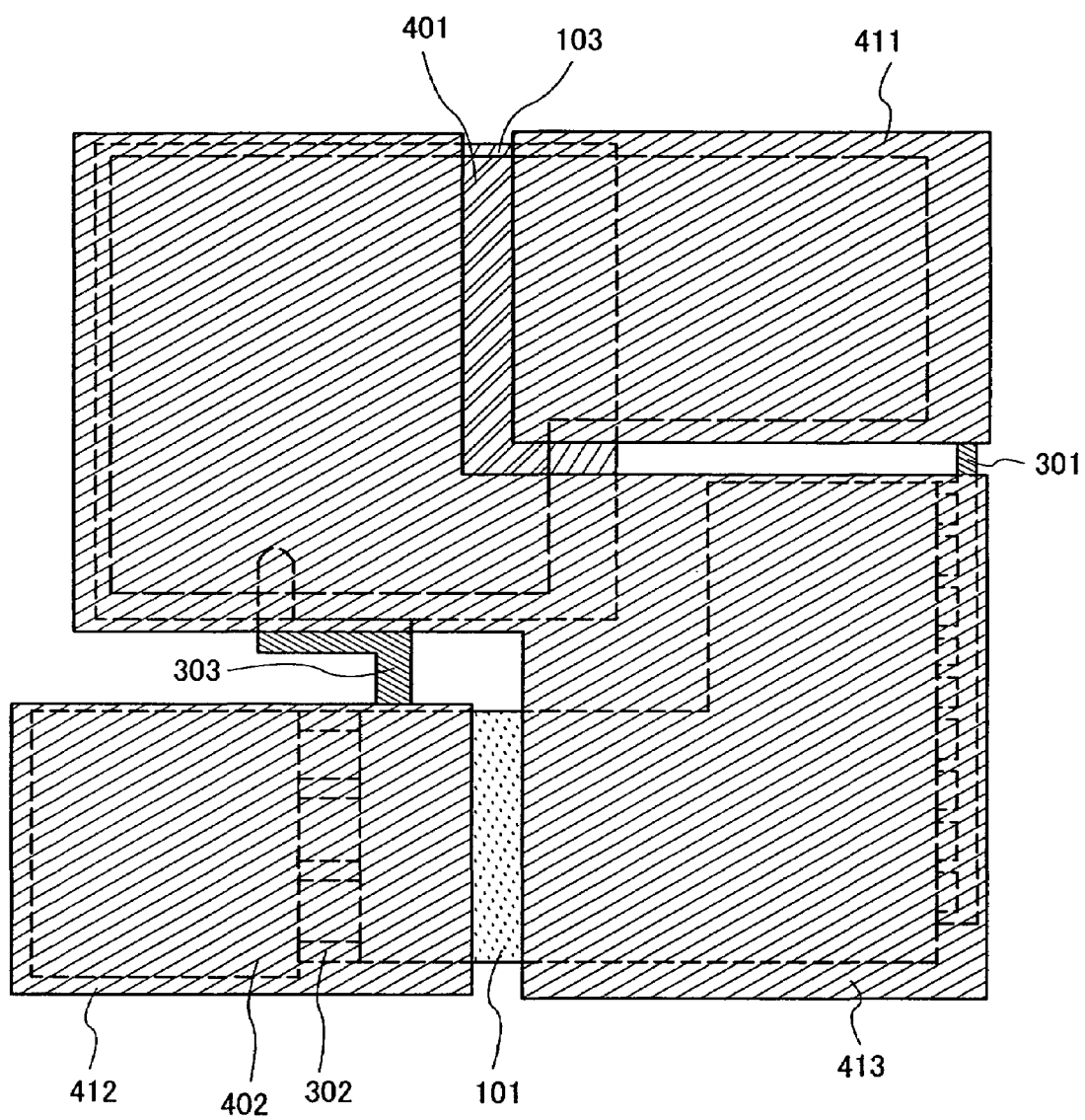
FIG. 13 is a plane-view diagram, corresponding to the cross-sectional-view diagram of FIG. 12, illustrating an example of a layout of a semiconductor device of the present invention.

In the present embodiment mode, another example of a structure of the semiconductor device 100 that is shown in FIG. 1 will be described. FIG. 12 is a diagram used to describe the structure of a cross section of the semiconductor device 100. FIG. 13 is a plane-view diagram used to describe an example of a layout of the semiconductor device 100 of FIG. 11.

FIG. 12, as with FIG. 3, is a cross-sectional-view diagram illustrating an example of the structure of the semiconductor device 100 when the current mirror circuit 101 is formed of top-gate n-channel TFTs. In FIG. 12, for the structure of a cross section of the current mirror circuit 101, the two transistors 104 and 105 that are provided in the current mirror circuit 101 are shown.

As shown in FIG. 12, the transistors 104 and 105 of the current mirror circuit 101 are formed over the substrate 200 with the insulating layer 201 that functions as a base film interposed between the transistors 104 and 105 and the substrate 200. In the present embodiment mode, the insulating layer 201 has a two-layer structure of a first insulating layer 201-1 and a second insulating layer 201-2. The insulating layer 300 is formed to cover the semiconductor layer of the transistors 104 and 105 and the gate electrodes. The insulating layer 300 functions as an interlayer insulating film.

The wiring 301 used to electrically connect the current mirror circuit 101 to the first terminal 111, the wiring 302 used to electrically connect the current mirror circuit 101 to the second terminal 112, the wiring 303 used to electrically connect the current mirror circuit 101 to the photodiode 103, and the electrodes 304 of the transistors 104 and 105 are formed over the insulating layer 300.

Moreover, the photovoltaic layer 140 that functions as the photodiode 103 is formed over the insulating layer 300. The photovoltaic layer 140 is formed of semiconductor layers that have a PIN junction. In the photovoltaic layer 140 shown in FIG. 8, the p-type semiconductor layer 140$p$, the i-type semiconductor layer 140$i$, and the n-type semiconductor layer 140$n$ are formed and stacked, in the order given, from the insulating layer 300 side. The p-type semiconductor layer 140$p$ of the photovoltaic layer 140 is formed so as to come into contact with the wiring 303.

An insulating layer 400 used to cover the current mirror circuit 101 and the photovoltaic layer 140 is formed. Electrodes 401 and 402 are formed over the insulating layer 400. The electrode 401 is electrically connected to the wiring 302, and the electrode 402 is electrically connected to the wiring 301 and the photovoltaic layer 140. An insulating layer 406 is formed to cover the insulating layer 400 and the electrodes 401 and 402. An insulating layer 407 is formed over the insulating layer 406, and a first terminal 411, a second terminal 412, and a dummy electrode 413 are formed over the insulating layer 407. Each of the first terminal 411, the second terminal 412, and the dummy electrode 413 are formed of one of the conductive films 314 and one of the conductive films 315. The conductive films 314 and 315 are films that have a single-layer structure or a stacked-layer structure of two or more layers. The first terminal 411, the second terminal 412, and the dummy electrode 413 are formed from the same conductive films and by the same process.

In the semiconductor device 100 in FIG. 12, insulating layers (the insulating layer 201, the insulating layer 300, and the insulating layer 309) are formed so that surfaces of conductive layers in the semiconductor device 100 other than the first terminal 411, the second terminal 412, and the dummy electrode 413 are covered so as not to be exposed to external.

The first terminal 411 is electrically connected to the current mirror circuit 101 via the electrode 401 and the wiring 301, and the second terminal 412 is electrically connected to the current mirror circuit 101 via the electrode 402 and the wiring 302 (refer to FIG. 12). As shown in FIG. 13, the dummy electrode 413 is formed adjacent to the first terminal 411 and the second terminal 412, and the area of the dummy electrode 413 is larger than both the area of the first terminal 411 and the area of the second terminal 412. Furthermore, the dummy electrode 413 is not electrically connected to any wiring or electrode in the semiconductor device 100.

In this way, because the dummy electrode 413 is formed adjacent to the first electrode 411 and the second electrode 412 and the area of the dummy electrode 413 is larger than both the area of the first terminal 411 and the area of the second terminal 412, the probability that damage due to electrostatic discharge will occur in the dummy electrode 413 can made to be higher than the probability that damage due to electrostatic discharge will occur in the first terminal 411 or the second terminal 412. Supposing that this is true, even if damage due to electrostatic discharge does occur in the dummy electrode 413, because the dummy electrode 313 is not electrically connected to any one of the current mirror circuit 101, the photodiode 103, the first terminal 411, or the second terminal 412, damage due to electrostatic discharge can be prevented from occurring in the semiconductor device 100.

Next, a manufacturing method of the semiconductor device 100 shown in FIG. 12 will be described. First, using the manufacturing method of Embodiment Mode 3, the structure of FIG. 10B is obtained. Next, the insulating layer 400 is formed. It is preferable that the insulating layer 400 be a resin film that functions as a planarized film. In addition, it is preferable that the insulating layer 400 be formed by a screen printing method or an inkjet printing method. By use of one of these methods, a contact hole that reaches the wirings 301 and 302 and the photovoltaic layer 140 can be formed in the insulating layer 400 without use of any etching process. For example, the insulating layer 400 can be formed of an epoxy resin by a screen printing method.

Next, as shown in FIG. 12, the insulating layer 306 is etched, and a contact hole that reaches the wirings 301 and 302 and the photoelectric layer 140 is formed. Then, the electrode 401 and the electrode 402 are formed over the insulating layer 400. These electrodes 401 and 402 can be formed in the same way as the electrode 308 is formed.

Next, the insulating layer 406 is formed to cover the electrode 401 and the electrode 402. The insulating layer 406 can be formed in the same way as the insulating layer 306 is formed. After a contact hole that reaches the electrode 401 and the electrode 402 is formed in the insulating layer 406, the insulating layer 407 is formed. The insulating layer 407 can be formed in the same way as the insulating layer 309 is formed. Next, the first terminal 411, the second terminal 412, and the dummy electrode 413 that are made from the conductive films 314 and 315 are formed. The first terminal 411, the second terminal 412, and the dummy electrode 413 can be formed in the same way as the first terminal 311, the second terminal 312, and the dummy electrode 313 are formed.

By the above steps, the semiconductor device 100 shown in FIG. 12 and FIG. 13 can be manufactured.

Figure 14:
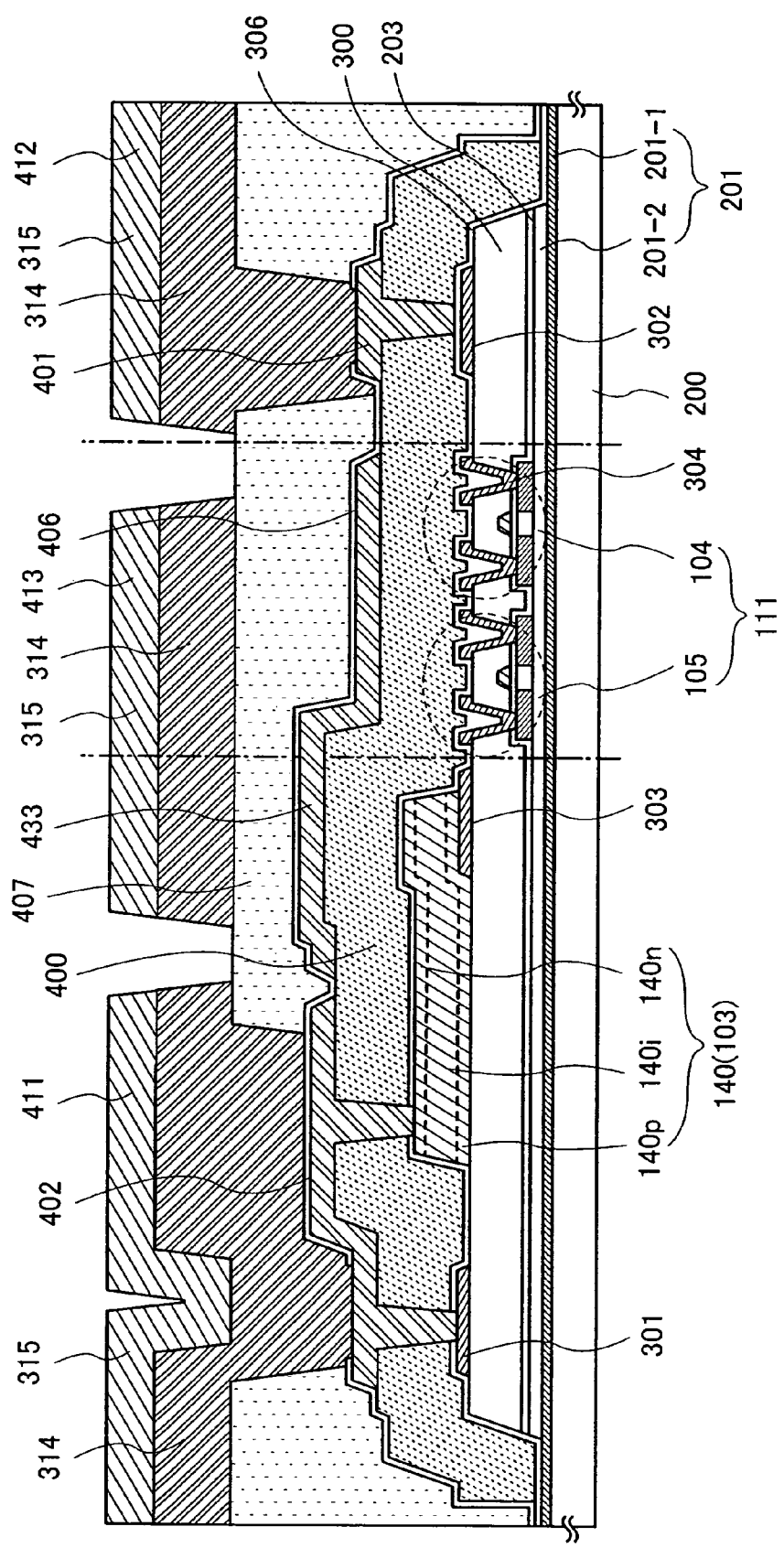
FIG. 14 is a cross-sectional-view diagram showing an example of a structure of a semiconductor device of the present invention.

It is to be noted that a different dummy electrode can be formed along with the electrode 401. A cross-sectional-view of the semiconductor device 100 that has this kind of dummy electrode is shown in FIG. 14. What differs from FIG. 12 is that a dummy electrode 433 is formed along with the electrode 401 and that, with the formation of the dummy electrode 433, the shape of the electrode 402 is changed. The dummy electrode 433, like the dummy electrode 413, is not electrically connected to any wiring or electrode in the semiconductor device 100. The dummy electrode 433 is formed with a larger area than both the area of the first terminal 411 and the area of the second terminal 412. It is to be noted that, when the dummy electrode 433 is formed, the dummy electrode 413 need not be formed.

Embodiment Mode 4

The substrate 200 used at the time of production of the semiconductor device 100 can be separated from the insulating layer 201, and the semiconductor device 100 can be transferred to a bendable plastic substrate that is thinner than a glass substrate. In the present embodiment mode, this kind of manufacturing method will be described.

First, as shown in FIG. 15A, an insulating layer 501 is formed over the substrate 200. For the insulating layer 501, a film formed of silicon oxide, silicon oxide that contains nitrogen, silicon nitride, silicon nitride that contains oxygen, or a metal oxide material by a sputtering method or a plasma CVD method may be used.

A peeling layer 502 is formed over the insulating layer 501. The peeling layer 502 can be formed of a metal film or an alloy film, for example. For this metal film, a film formed of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like can be used. For the alloy film, a film formed of an alloy of a plurality of metal elements selected from these metal elements, such as an alloy of tungsten and molybdenum or the like, can be used. These metal films and alloy films can be formed by a sputtering method. In addition, the metal film or alloy film to be used for the peeling layer 502 should be formed at a thickness of less than or equal to 20 nm and greater than or equal to 100 nm.

Next, in order that separation between the insulating layer 201 and the peeling layer 502 occur preferentially, the surface of the metal film or alloy film formed for the peeling layer 502 is oxidized. For methods of oxidation of the peeling layer, there is a thermal oxidation method, a method in which a surface is treated with oxygen or an $N_2O$ plasma, a method in which a surface is treated with a highly oxidative solution such as ozone water or the like, and the like. Furthermore, for an alternative method, there is a method in which, when the insulating layer 201 is formed, an oxide is formed in the interface between the insulating layer 201 and the peeling layer. For example, by formation of a film that contains an oxide of silicon as its main component for the first insulating layer 201-1 by a sputtering method, if the oxide of silicon is deposited on the surface of a metal film or alloy film, the surface of the metal film or alloy film can be oxidized. It is to be noted that the metal film or alloy film may be nitrided by plasma treatment or heat treatment instead of being oxidized.

Next, as shown in FIG. 15B, the semiconductor device 100 that functions as a light sensor is formed over the insulating layer 201. In the present embodiment mode, the semiconductor device 100 shown in FIG. 11 is fabricated.

Subsequently, as shown in FIG. 16, a support substrate 506 is attached to the semiconductor device 100 by an adhesive 505. It is to be noted that it is preferable that a substrate that is more rigid than the substrate 200 be used for the support substrate 506. Typically, a glass substrate, a quartz substrate, a metal substrate, a ceramic substrate, or a plastic substrate can be applied for the support substrate 506, as appropriate.

Furthermore, for the adhesive 505, an adhesive formed from an organic material may be used. At this time, a planarized layer may be formed for part of the adhesive. In the present embodiment mode, for a planarized layer, a water-soluble resin 505-1 made from an organic material is applied to an adhesive, a material 505-2 covered with a reactive peeling adhesive on both sides (hereinafter referred to as a double-sided sheet 505-2) is affixed to the surface of the adhesive to which the water-soluble resin 505-1 is applied, and then the double-sided sheet 505-2 is affixed to the support substrate 506.

By use of this bonding method, the peeling step to be performed afterward can be performed with the use of a comparatively small amount of force. For the adhesive formed from an organic material, various types of peeling adhesives, such as a reactive peeling adhesive; a thermally deactivated adhesive; an adhesive that is deactivated by application of light, such as an adhesive deactivated by ultraviolet light or the like; an anaerobically deactivated adhesive; and the like, can be given.

Next, separation is made to occur between the peeling layer 502 and the insulating layer 201 that are formed over the substrate 200, and the semiconductor device 100 is separated from the substrate 200. By a method in which a physical force is applied, the semiconductor device 100 and the substrate 200 can be separated from each other. For example, the semiconductor device 100 can be separated from the substrate 200 by use of a load that uses a component that has a sharp edge such as a wedge or the like, by use of a person's hand, by use of wind pressure of a gas blown from a nozzle, or the like.

Figure 17:
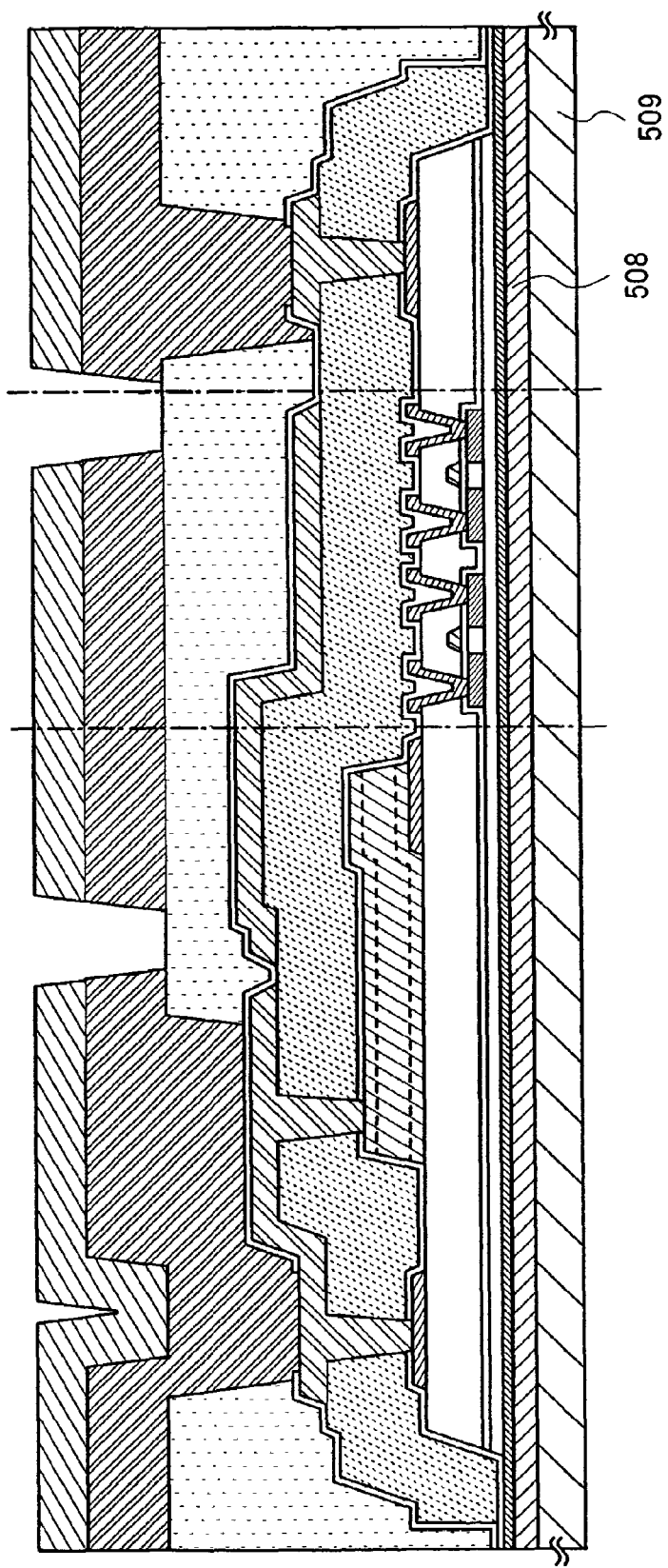
FIG. 17 is a cross-sectional-view diagram showing an example of a structure of a semiconductor device of the present invention.

Next, as shown in FIG. 17, a flexible substrate 509 is attached to the insulating layer 201 by a binding material 508. For the binding material 508, any of a variety of different kinds of curable binders, such as a reactive-curable binder, a thermally curable binder, a light-curable binder such as a UV curable binder or the like, an anaerobic-curable binder, or the like, can be used. In the present embodiment mode, an epoxy resin may be used for the binding material 508. Furthermore, for the flexible substrate 509, for example, a film formed of polyimide (PI), polyethylene naphthalate (PEN), polyethylene terephthalate (PET), or the like can be used.

Next, the semiconductor device 100 is separated from the adhesive 505 and the support substrate 506. By the adhesive 505 that is made from an organic material being made to react due to application of heat, light, or moisture or being made to undergo a chemical reaction, the adhesiveness of the adhesive 505 is decreased, and the support substrate 506 as well as the adhesive 505 can be separated from the semiconductor device 100.

By the above steps, the semiconductor device 100 that is affixed to the flexible substrate 509 can be formed. The semiconductor device 100 that is fabricated according to the present embodiment mode can be made to be lightweight, thin, and bendable.

Embodiment Mode 5

Because the semiconductor device of the present invention is used to function as a light sensor, the semiconductor device can be incorporated into a variety of electronic devices. In the present embodiment mode, electronic devices in which the semiconductor device of the present invention is implemented will be described. For these kinds of electronic devices, computers, displays, cellular phones, televisions, and the like can be given. Specific examples are shown in FIG. 18, FIGS. 19A and 19B, FIGS. 20A and 20B, FIG. 21, and FIG. 22.

Figure 18:
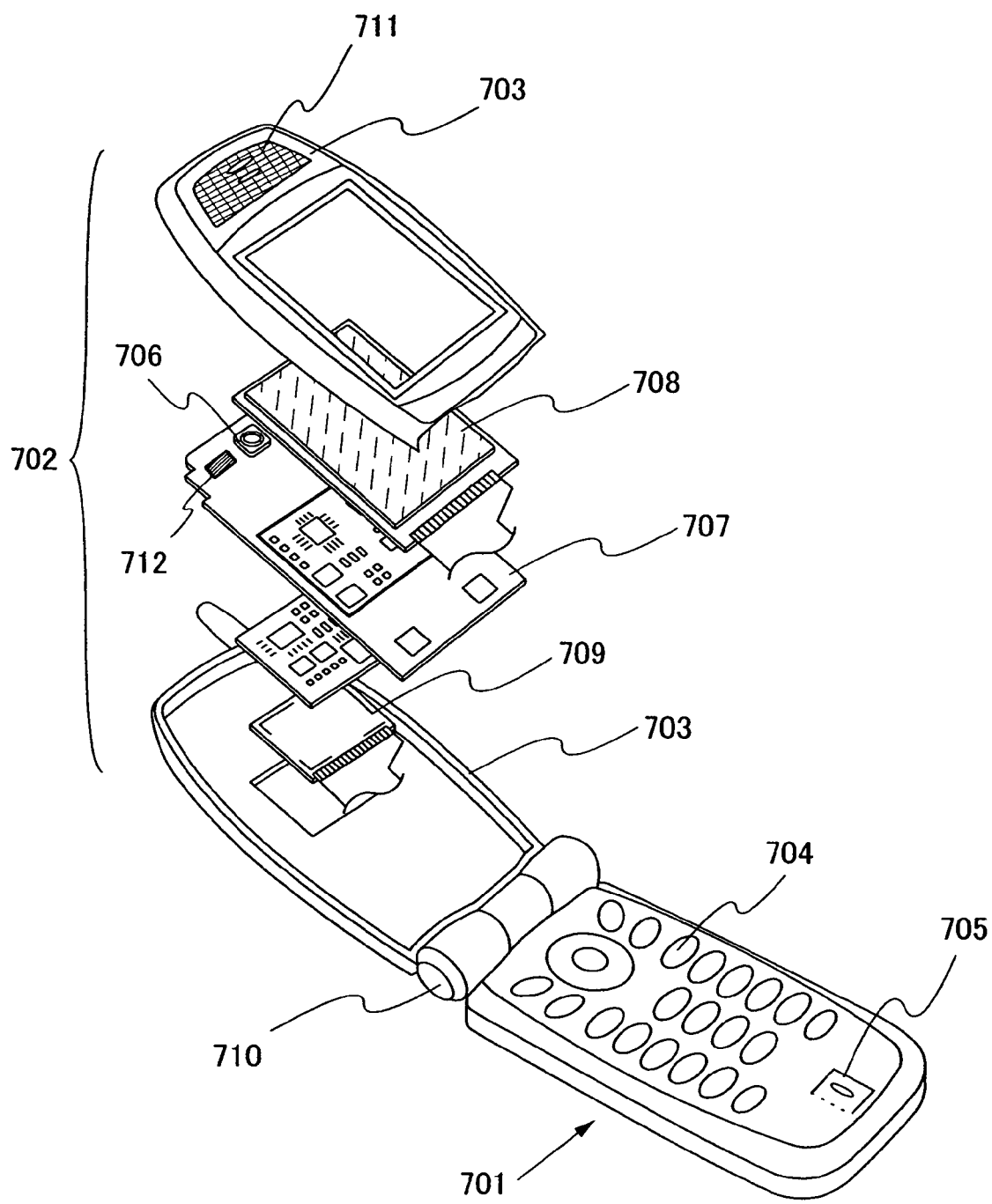
FIG. 18 is an exploded-view diagram of a cellular phone in which a semiconductor device of the present invention is implemented.

FIG. 18 is a diagram of a cellular phone that has a main body 701, a main body 702, a case 703, operation keys 704, an audio input 705, an audio output 706, a circuit board 707, a display panel 708, a display panel 709, a hinge 710, a light-transmitting material 711, and a light sensor 712. The present invention can be applied to the light sensor 712.

The light sensor 712 detects light that passes through the light-transmitting material 711, control of the brightness of the display panel 708 and the display panel 709 is performed so that the brightness matches the brightness of external light that has been detected, and lighting control of the operation keys 704 is performed so that the brightness matches the brightness obtained by the light sensor 712. By these steps, power dissipation in the cellular phone can be suppressed.

Figure 19A:
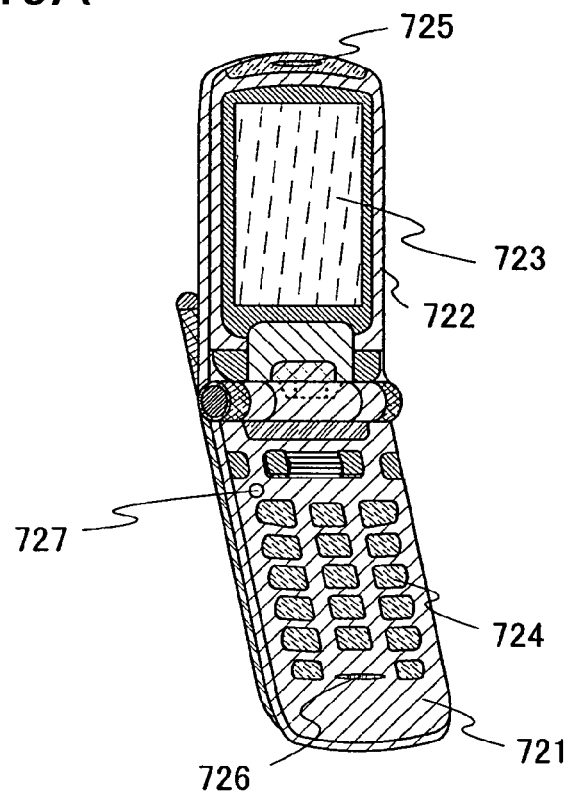
FIGS. 19A and 19B are drawings of external views of a cellular phone in which a semiconductor device of the present invention is implemented.
Figure 19B:
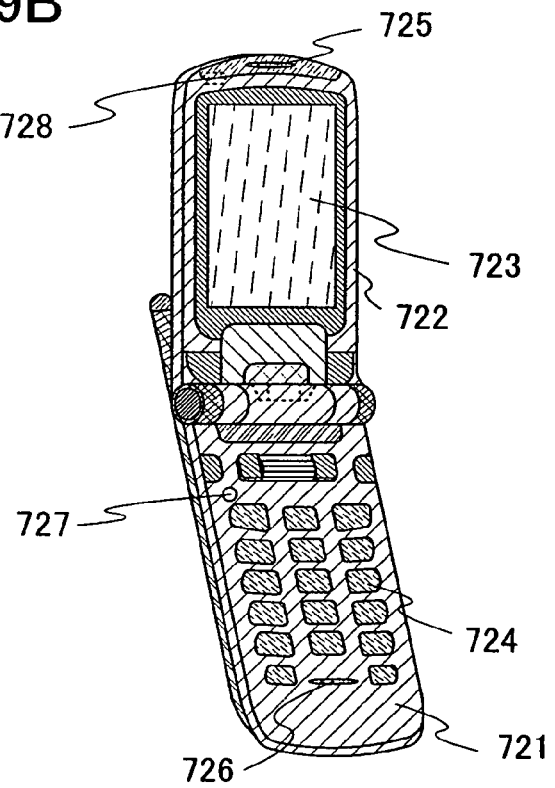

Different examples of a cellular phone are shown in FIGS. 19A and 19B. In FIGS. 19A and 19B, reference numeral 721 refers to a main body, reference numeral 722 refers to a case, reference numeral 723 refers to a display panel, reference numeral 724 refers to operation keys, reference numeral 725 refers to an audio output, reference numeral 726 refers to an audio input, and reference numerals 727 and 728 refer to light sensors.

In the cellular phone shown in FIG. 19A, the brightness of the display panel 723 and the operation keys 724 can be controlled by detection of external light by the light sensor 727 that is provided in the main body 721.

In the cellular phone shown in FIG. 19B, in addition to what is provided in the structure of FIG. 19A, the light sensor 728 is provided inside the main body 721. The luminance of a backlight provided in the display panel 723 can be detected by the light sensor 728.

Figure 20A:
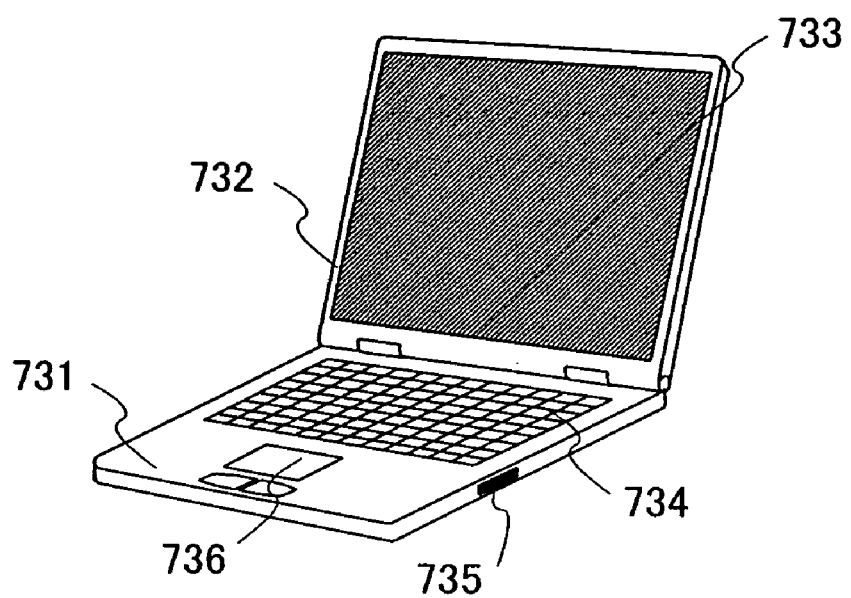
FIG. 20A is a diagram illustrating a computer in which a semiconductor device of the present invention is implemented.

FIG. 20A is a diagram of a computer that has a main body 731, a case 732, a display 733, a keyboard 734, an external connection port 735, a pointing device 736, and the like.

Figure 20B:
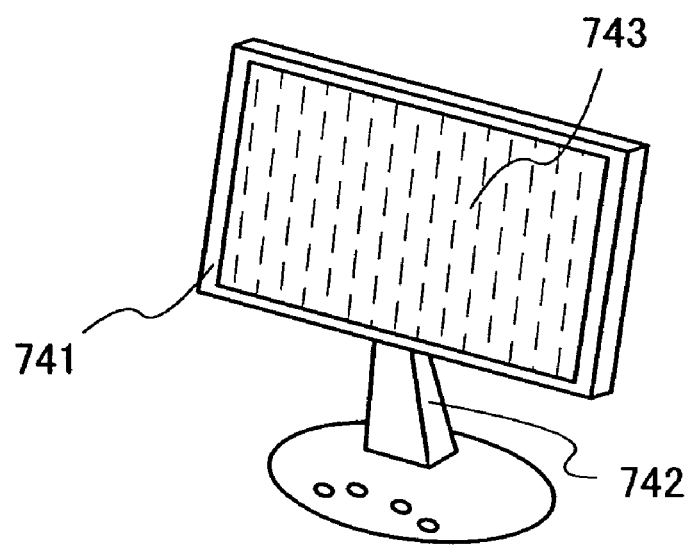
FIG. 20B is a diagram illustrating a display device in which a semiconductor device of the present invention is implemented.

Furthermore, FIG. 20B is a diagram of a display device representing a television set or the like. The present display device is formed of a chassis 741, a support stand 742, a display 743, and the like.

Figure 21:
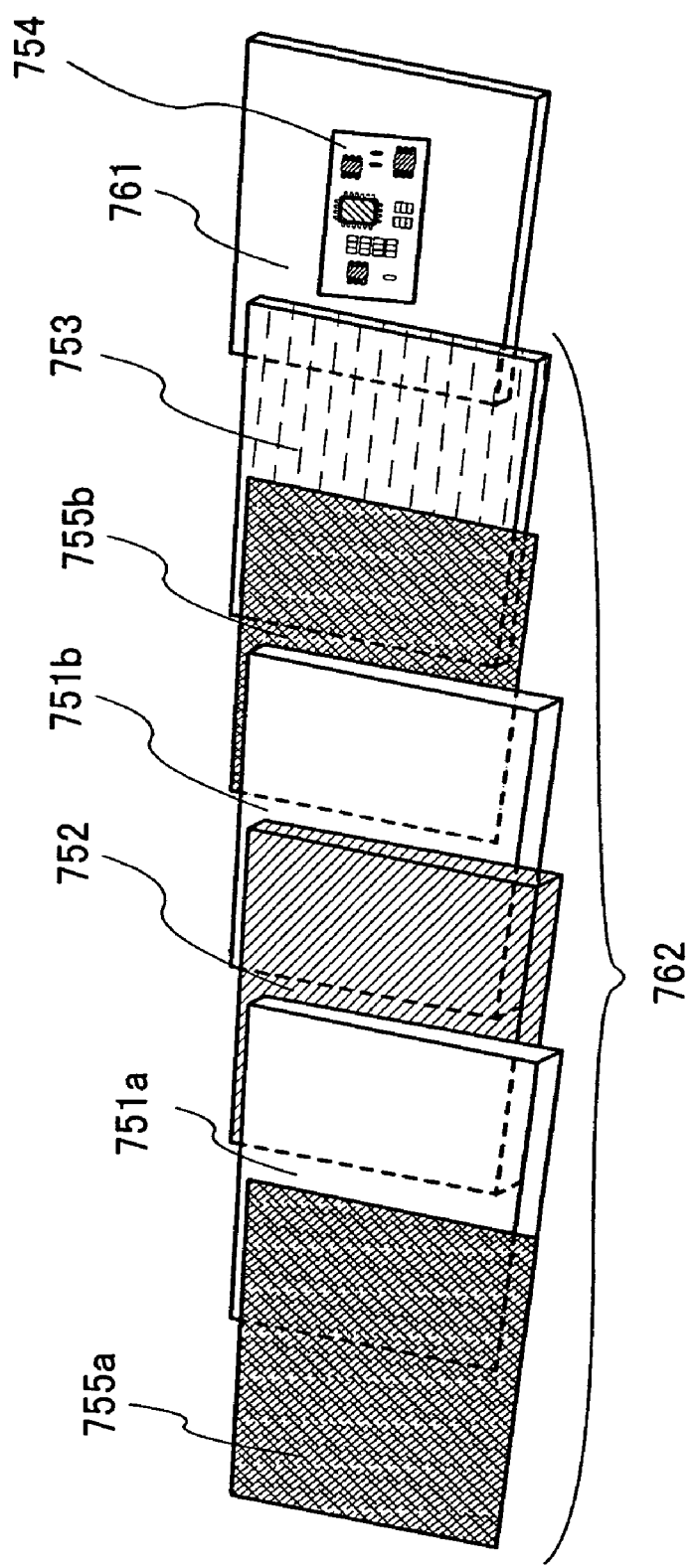
FIG. 21 is an exploded-view diagram of the display device of FIG. 20B.

A detailed structure of a display panel when a liquid crystal panel is used for the display 733 that is provided in the computer of FIG. 20A and the display 743 of the display device shown in FIG. 20B is shown in FIG. 21.

A liquid crystal panel 762 shown in FIG. 21 is installed in a case 761 and has substrates 751a and 751b, a liquid crystal layer 752 that is interposed between the substrates 751a and 751b, polarization filters 755a and 755b, a backlight 753, and the like. Furthermore, a light sensor formation region 754 that has a light sensor is formed in the case 761.

By feedback of information from the backlight 753 about the amount of light perceived in the light sensor formation region 754, which is manufactured using the present invention, to the backlight 753, the luminance of the liquid crystal display panel 762 is adjusted.

Figure 22A:
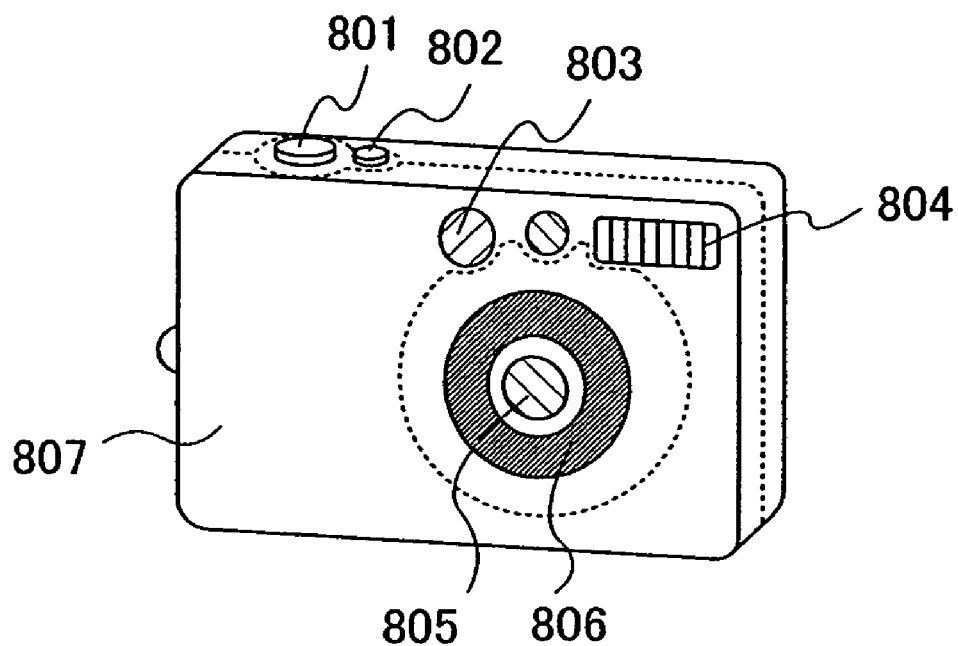
FIGS. 22A and 22B are diagrams illustrating a camera in which a semiconductor device of the present invention is implemented.
Figure 22B:
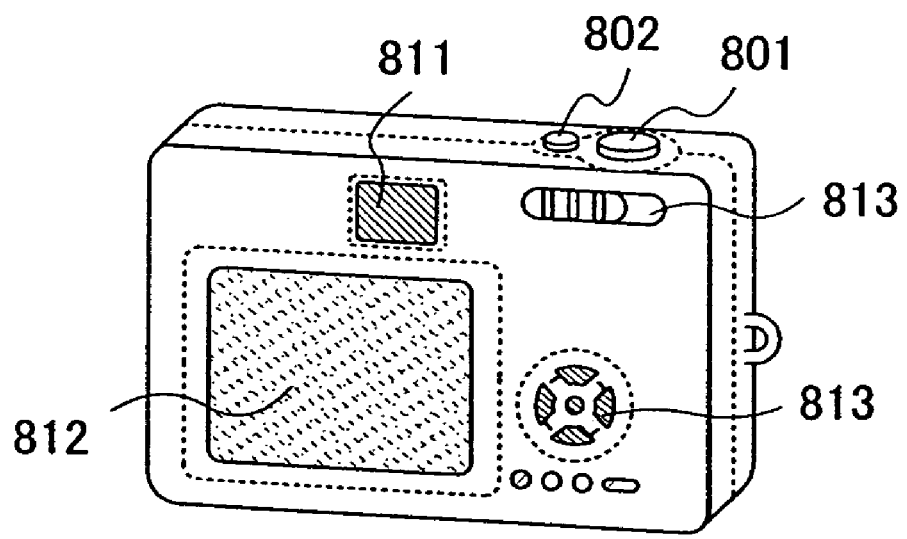

FIGS. 22A and 22B are diagrams showing an example of a camera, for example, a digital camera, into which the light sensor of the present invention is incorporated. FIG. 22A is a perspective diagram of a digital camera as seen from the front, and FIG. 22B is a perspective diagram of the digital camera as seen from the back. In FIG. 22A, in the digital camera, a release button 801, a main switch 802, a viewfinder window 803, a flash 804, a lens 805, a barrel 806, and a case 807 are provided.

Furthermore, in FIG. 22B, a viewfinder eyepiece window 811, a monitor 812, and operation buttons 813 are provided.

If the release button 801 is pressed down halfway, functions for adjustment of focusing and exposure start operating, and if the release button 801 is pressed down all the way, the shutter opens.

Power for the digital camera switches between ON and OFF when the main switch 802 is pressed or turned.

The viewfinder window 803 is located above the lens 805 on the front of the digital camera and is a device used to verify the area within which a picture will be taken as well as the location of the point of focus as viewed from the viewfinder eyepiece window 811 shown in FIG. 22B.

The flash 804 is located in the upper area of the front side of the digital camera; when the luminance of the object to be photographed is low, fill-in light is flashed at the same time as the shutter opens when the release button 801 is pressed.

The lens 805 is located on the front side of the digital camera. The lens 805 is formed of a focusing lens, a zoom lens, or the like and makes up a photography optical system along with a shutter and camera diaphragm that are not shown. Furthermore, an imaging element such as a charge coupled device (CCD) or the like is provided at the back of the lens 805.

The barrel 806 is an object used to move the location of the lens 805 so that the lens matches up with the focus of a focusing lens, zoom lens, or the like. When a picture is being taken, the barrel 806 extends out and the lens 805 is made to move forward. Furthermore, when the digital camera is being carried around, the lens 805 is collapsed, and the camera is made to be compact. It is to be noted that, in the present embodiment mode, the digital camera has a structure by which zoom photography can be done by extension of the barrel 806; however, the digital camera is not limited to having this kind of structure only, and a digital camera with a structure in which zoom photography can be done, even without any extension of the barrel 806, by use of a photography optical system provided in the case 807 may be used, as well.

The viewfinder eyepiece window 811 is located in the upper area of the back side of the digital camera and is a window provided so that the area within which a picture will be taken as well as the location of the point of focus before a picture is taken can be viewed.

The operation buttons 813 are buttons for each function provided on the back side of the digital camera and are formed as a setup button, a menu button, a display button, a function button, a selection button, and the like.

If the light sensor of the present invention is incorporated into the camera shown in FIGS. 22A and 22B, the presence and intensity of light can be perceived by the light sensor, and adjustment of exposure and the like for the camera can be performed based on what is perceived by the light sensor.

In addition, the light sensor of the present invention can be applied to a wide variety of other electronic devices, for example, projection televisions, navigation systems, and the like.

This application is based on Japanese Patent Application serial No. 2006-351877 filed in Japan Patent Office on Dec. 27, 2006, the contents of which are hereby incorporated by reference.

What is claimed is:

1. A semiconductor device comprising:
   a photovoltaic element;
   a circuit electrically connected to the photovoltaic element;
   a first terminal electrically connected to the photovoltaic element;
   a second terminal electrically connected to the circuit; and
   a conductive film adjacent to the first terminal and the second terminal,
   wherein the conductive film is not electrically connected to the photovoltaic element and the conductive film is not electrically connected to the circuit,
   wherein an area of an upper surface of the conductive film is larger than an area of an upper surface of the first terminal, and
   wherein the area of the upper surface of the conductive film is larger than an area of an upper surface of the second terminal.

2. The semiconductor device according to claim 1,
wherein the photovoltaic element comprises a photovoltaic layer; and
wherein the conductive film is a film that reflects light and the conductive film overlaps with the photovoltaic layer.

3. The semiconductor device according to claim 1,
wherein the photovoltaic element comprises a photovoltaic layer; and
wherein the conductive film is a film that reflects light and the conductive film does not overlap with the photovoltaic layer.

4. The semiconductor device according to claim 1,
wherein the area of the upper surface of the conductive film is not less than twice a larger area of the areas of upper surfaces of the first and second terminals.

5. An electronic device having the semiconductor device according to claim 1, wherein the electronic device is selected from the group consisting of a cellular phone, a computer, a display device, and a digital camera.

6. A semiconductor device comprising:
a photovoltaic element;
a circuit electrically connected to the photovoltaic element;
a first terminal electrically connected to the photovoltaic element;
a second terminal electrically connected to the circuit;
a conductive film adjacent to the first terminal and the second terminal, wherein the conductive film is not electrically connected to the photovoltaic element and the conductive film is not electrically connected to the circuit; and
an insulating film covering the photovoltaic element and the circuit,
wherein the first terminal, the second terminal, and the conductive film are formed over the insulating film,
wherein an area of an upper surface of the conductive film is larger than an area of an upper surface of the first terminal, and
wherein the area of the upper surface of the conductive film is larger than an area of an upper surface of the second terminal.

7. The semiconductor device according to claim 6,
wherein the photovoltaic element comprises a photovoltaic layer; and
wherein the conductive film is a film that reflects light and the conductive film overlaps with the photovoltaic layer.

8. The semiconductor device according to claim 6,
wherein the photovoltaic element comprises a photovoltaic layer; and
wherein the conductive film is a film that reflects light and the conductive film does not overlap with the photovoltaic layer.

9. The semiconductor device according to claim 6,
wherein the area of the upper surface of the conductive film is not less than twice a larger area of the areas of upper surfaces of the first and second terminals.

10. An electronic device having the semiconductor device according to claim 6, wherein the electronic device is selected from the group consisting of a cellular phone, a computer, a display device, and a digital camera.

11. A semiconductor device comprising:
thin film transistors and a wiring over a substrate;
a first insulating film over the thin film transistors and the wiring;
a photovoltaic element over the first insulating film and above the thin film transistors,
a second insulating film over the first insulating film and the photovoltaic element,
a conductive film over the second insulating film and the thin film transistors;
a first terminal formed in a first contact hole formed in the second insulating film and over the photovoltaic element; and
a second terminal formed in a second hole formed in the second insulating film and over the wiring;
wherein the thin film transistors are electrically connected to the photovoltaic element,
wherein the first terminal is electrically connected to the photovoltaic element,
wherein the second terminal is electrically connected to the thin film transistors,
wherein the conductive film is not electrically connected to the photovoltaic element and the conductive film is not electrically connected to the thin film transistors,
wherein an area of an upper surface of the conductive film is larger than an area of an upper surface of the first terminal, and
wherein the area of the upper surface of the conductive film is larger than an area of an upper surface of the second terminal.

12. An electronic device having the semiconductor device according to claim 11, wherein the electronic device is selected from the group consisting of a cellular phone, a computer, a display device, and a digital camera.

13. A semiconductor device comprising:
a photovoltaic element;
a circuit electrically connected to the photovoltaic element;
a first terminal electrically connected to the photovoltaic element;
a second terminal electrically connected to the circuit;
a first conductive film adjacent to the first terminal and the second terminal;
an insulating layer over the first conductive film; and
a second conductive film over the insulating layer,
wherein the first and second conductive film are not electrically connected to the photovoltaic element and the conductive film is not electrically connected to the circuit,
wherein an area of an upper surface of the second conductive film is larger than an area of an upper surface of the first terminal, and
wherein the area of the upper surface of the second conductive film is larger than an area of an upper surface of the second terminal.

14. An electronic device having the semiconductor device according to claim 13, wherein the electronic device is selected from the group consisting of a cellular phone, a computer, a display device, and a digital camera.

* * * * *